US012794498B2

(12) United States Patent
Chen et al.

(10) Patent No.: US 12,794,498 B2
(45) Date of Patent: Nov. 10, 2026

(54) TUNABLE FILTER WITH MUTUALLY COUPLED INDUCTORS

(71) Applicant: Skyworks Solutions, Inc., Irvine, CA (US)

(72) Inventors: Kun Chen, Thousand Oaks, CA (US); Joshua Kawika Ellis, Camarillo, CA (US); Shayan Farahvash, Kensington, CA (US); Haibo Cao, Newbury Park, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 38 days.

(21) Appl. No.: 18/967,393

(22) Filed: Dec. 3, 2024

(65) Prior Publication Data

US 2025/0096830 A1 Mar. 20, 2025

Related U.S. Application Data

(63) Continuation of application No. 17/351,886, filed on Jun. 18, 2021, now Pat. No. 12,199,651.

(Continued)

(51) Int. Cl.
*H04B 1/10* (2006.01)
*H03H 7/01* (2006.01)

(52) U.S. Cl.
CPC ............ *H04B 1/10* (2013.01); *H03H 7/0115* (2013.01); *H03H 7/0153* (2013.01); *H04B 1/1027* (2013.01)

(58) Field of Classification Search
CPC ...... H04B 1/10; H04B 1/1027; H04B 1/0458; H04B 1/40; H03H 7/0115; H03H 7/0153;
(Continued)

(56) References Cited

U.S. PATENT DOCUMENTS 7,400,212 B1 7/2008 Vishinsky
9,455,680 B2 9/2016 Leipold et al.
(Continued)

FOREIGN PATENT DOCUMENTS

EP 2807745 5/2020
JP 2015-508621 3/2015
(Continued)

OTHER PUBLICATIONS

U.S. Appl. No. 17/351,886 Published as 2021/0408992 A1 Issued U.S. Pat. No. 12,199,651, filed Jun. 18, 2021, Tunable Filter With Mutually Coupled Inductors.

(Continued)

*Primary Examiner* — Renan Luque

(74) *Attorney, Agent, or Firm* — Knobbe, Martens, Olson & Bear, LLP

(57) ABSTRACT

Aspects of this disclosure relate to a tunable filter with tunable rejection. The tunable filter includes mutually coupled inductors and a tunable impedance circuit electrically connected to at least one of the mutually coupled inductors. The tunable impedance circuit is configured to adjust at least two notches in a frequency response of the tunable filter by changing a state of a switch. The tunable filter can filter a radio frequency signal. Related methods, radio frequency systems, radio frequency modules, and wireless communication devices are also disclosed.

20 Claims, 19 Drawing Sheets

Related U.S. Application Data

(60) Provisional application No. 63/071,261, filed on Aug. 27, 2020, provisional application No. 63/046,184, filed on Jun. 30, 2020.

(58) Field of Classification Search
CPC ........ H03H 7/075; H03H 7/09; H03H 7/1758; H03H 7/1766; H03H 2007/013; H03H 7/38
See application file for complete search history.

(56) References Cited

U.S. PATENT DOCUMENTS

| | | | | |
|---|---|---|---|---|
| 9,685,928 | B2 | 6/2017 | Maxim et al. | |
| 9,735,752 | B2 | 8/2017 | Madan et al. | |
| 9,780,756 | B2 | 10/2017 | Maxim et al. | |
| 9,859,867 | B2 | 1/2018 | Westmoreland | |
| 10,079,586 | B2 | 9/2018 | Ellä et al. | |
| 10,658,999 | B1 | 5/2020 | Atalla et al. | |
| 10,951,190 | B2 | 3/2021 | Atalla et al. | |
| 11,824,569 | B2 | 11/2023 | Jia et al. | |
| 11,909,428 | B2 | 2/2024 | Chen et al. | |
| 12,003,263 | B2 | 6/2024 | Jia et al. | |
| 12,199,651 | B2 * | 1/2025 | Chen | H03H 7/1758 |
| 12,362,776 | B2 | 7/2025 | Jia et al. | |
| 2004/0183626 | A1 | 9/2004 | Kang et al. | |
| 2013/0187712 | A1 | 7/2013 | Cabannilas et al. | |
| 2014/0055210 | A1 | 2/2014 | Black et al. | |
| 2014/0285286 | A1 | 9/2014 | Bojer | |
| 2015/0014985 | A1 | 1/2015 | Cordes et al. | |
| 2015/0035617 | A1 | 2/2015 | Leipold et al. | |
| 2015/0035622 | A1 | 2/2015 | Maxim et al. | |
| 2015/0065070 | A1 | 3/2015 | Maxim et al. | |
| 2015/0084718 | A1 | 3/2015 | Maxim et al. | |
| 2015/0087246 | A1 | 3/2015 | Khlat | |
| 2015/0094008 | A1 | 4/2015 | Maxim et al. | |
| 2015/0097637 | A1 | 4/2015 | Pye et al. | |
| 2016/0336983 | A1 | 11/2016 | Wang et al. | |
| 2016/0381649 | A1 | 12/2016 | Anthony et al. | |
| 2017/0063411 | A1 | 3/2017 | Ripley et al. | |
| 2017/0063412 | A1 | 3/2017 | Ripley et al. | |
| 2017/0063413 | A1 | 3/2017 | Ripley et al. | |
| 2017/0331444 | A1 | 11/2017 | Mori | |
| 2018/0131267 | A1 * | 5/2018 | Limjoco | H02M 1/143 |
| 2018/0183483 | A1 | 6/2018 | Kogure et al. | |
| 2018/0198474 | A1 | 7/2018 | Obiya et al. | |
| 2018/0226946 | A1 | 8/2018 | Kim et al. | |
| 2018/0233604 | A1 | 8/2018 | Gu et al. | |
| 2019/0109575 | A1 * | 4/2019 | Darvishi | H04J 1/045 |
| 2019/0260355 | A1 | 8/2019 | Khlat | |
| 2019/0363691 | A1 | 11/2019 | Bojer et al. | |
| 2020/0007177 | A1 | 1/2020 | Ripley et al. | |
| 2020/0059217 | A1 | 2/2020 | Masse et al. | |
| 2020/0136588 | A1 | 4/2020 | Alicioglu et al. | |
| 2020/0252042 | A1 | 8/2020 | Mori et al. | |
| 2021/0143852 | A1 | 5/2021 | Pehlke | |
| 2021/0408992 | A1 | 12/2021 | Chen et al. | |
| 2021/0409047 | A1 | 12/2021 | Chen et al. | |
| 2022/0069786 | A1 | 3/2022 | Jia et al. | |
| 2022/0069854 | A1 | 3/2022 | Jia et al. | |
| 2023/0083695 | A1 | 3/2023 | Blamon et al. | |
| 2023/0318646 | A1 | 10/2023 | Jia et al. | |
| 2024/0297674 | A1 | 9/2024 | Jia et al. | |

FOREIGN PATENT DOCUMENTS

| | | |
|---|---|---|
| WO | WO 2013/112627 | 8/2013 |
| WO | WO 2016/089532 | 6/2016 |
| WO | WO 2016/125515 | 8/2016 |
| WO | WO 2018/189234 | 10/2018 |
| WO | WO 2019/107081 | 6/2019 |

OTHER PUBLICATIONS

U.S. Appl. No. 17/351,984 Published as 2021/0409047 A1 Issued U.S. Pat. No. 11,909,428, filed Jun. 18, 2021, Tunable Filter With Harmonic Rejection.

Cheon et al., "Compact frequency-divided micro-electromechanical systems tunable filter using inductively coupled structure", Micro & Nano Letters, 2015, vol. 10, Issue 5, pp. 233-235.

* cited by examiner

TUNABLE FILTER WITH MUTUALLY COUPLED INDUCTORS

CROSS REFERENCE TO PRIORITY APPLICATIONS

Any and all applications for which a foreign or domestic priority claim is identified in the Application Data Sheet as filed with the present application are hereby incorporated by reference under 37 C.F.R. § 1.57. This application is a continuation of U.S. application Ser. No. 17/351,886, filed Jun. 18, 2021 and titled "TUNABLE FILTER WITH MUTUALLY COUPLED INDUCTORS," which claims the benefit of priority of U.S. Provisional Application No. 63/046,184, filed Jun. 30, 2020 and titled "TUNABLE FILTER WITH MUTUALLY COUPLED INDUCTORS," and also claims the benefit of priority of U.S. Provisional Application No. 63/071,261, filed Aug. 27, 2020 and titled "TUNABLE FILTER WITH MUTUALLY COUPLED INDUCTORS," the disclosures of each of which are hereby incorporated by reference in their entireties.

BACKGROUND

Technical Field

Embodiments of this disclosure relate to filters arranged to filter signals, such as radio frequency signals.

Description of Related Technology

Radio frequency (RF) communication systems can be used for transmitting and/or receiving signals of a wide range of frequencies. For example, an RF communication system can be used to wirelessly communicate RF signals in a frequency range from about 30 kHz to about 300 GHz, such as in the range of about 410 megahertz (MHz) to about 7.125 gigahertz (GHz) for Fifth Generation (5G) cellular communications in Frequency Range 1 (FR1).

RF communication systems can include without limitation mobile phones, tablets, base stations, network access points, customer-premises equipment (CPE), laptops, and wearable electronics.

In certain applications, RF communications systems can process a plurality of RF signals concurrently. In such RF communications systems, filters with strong harmonic rejection can be desirable. Filters with strong harmonic rejection are desirable in a variety of applications.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a tunable filter with tunable rejection. The tunable filter includes a first inductor, a second inductor mutually coupled with the first inductor, and a tunable impedance circuit electrically connected to the first inductor. The tunable impedance circuit includes a switch and is configured to adjust at least two notches in a frequency response of the tunable filter by changing a state of the switch. The tunable filter is arranged to filter a radio frequency signal.

The switch can be arranged to selectively electrically couple an end of a capacitor to the first inductor. The tunable impedance circuit can include a second switch arranged to selectively electrically couple an end of a second capacitor to the first inductor.

Changing the state of the switch can adjust the location of at least three notches in the frequency response in certain applications.

The location of a notch in a frequency response of the tunable filter can be based on at least a state of the tunable impedance circuit and the mutual coupling of the first inductor with the second inductor.

The tunable impedance circuit can include a tunable capacitance circuit. The tunable capacitance circuit can provide a shunt capacitance at a node between the first inductor and the second inductor. Alternatively, the tunable capacitance circuit can be in parallel with the first inductor. The tunable capacitance circuit can also be in series with the second inductor. The tunable filter can further include a second tunable capacitance circuit in parallel with the second inductor.

The first inductor can be in series with the second inductor, a first capacitance can be in parallel with the first inductor, and a second capacitance can be in parallel with the second inductor. The tunable filter can further include a shunt capacitor coupled between the first inductor and the second inductor. The tunable impedance circuit can be configured to provide the first capacitance.

The first inductor can be a series inductor, and the second inductor can be a shunt inductor. The tunable impedance circuit can include a tunable capacitance circuit in parallel with the first inductor. The tunable filter can further include an inductor-capacitor circuit in series with the first inductor. The inductor-capacitor circuit can include a third inductor, and the third inductor can be mutually coupled with at least one of the first inductor or the second inductor.

The at least two notches can provide harmonic rejection.

Another aspect of this disclosure is a method of filtering radio frequency signals. The method includes filtering a first radio frequency signal with a tunable filter in a first state; after the filtering the first radio frequency signal, changing a state of a switch of a tunable impedance circuit of the tunable filter from the first state to a second state to adjust the location of at least two notches of a frequency response of the tunable filter corresponding to harmonics, the tunable filter including mutually coupled inductors and the tunable impedance circuit, the tunable impedance circuit electrically connected to the mutually coupled inductors; and while the tunable filter is in the second state, filtering a second radio frequency signal with the tunable filter.

Changing the state of the switch can adjust at least three notches of the frequency response of the tunable filter in certain applications.

Another aspect of this disclosure is a wireless communication device that includes a tunable filter and an antenna configured to transmit a radio frequency signal filtered by the tunable filter. The tunable filter includes a first inductor, a second inductor mutually coupled with the first inductor, and a tunable impedance circuit electrically connected to the first inductor. The tunable impedance circuit includes a switch and is configured to adjust at least two notches in a frequency domain of the tunable filter by changing a state of the switch.

The wireless communication device can include an antenna switch, and the tunable filter can be coupled between the antenna switch and the antenna.

The wireless communication device can include a power amplifier and a band select switch, and the tunable filter can be coupled between the power amplifier and the band select switch.

Another aspect of this disclosure is a tunable filter with harmonic rejection. The tunable filter includes a first inductor, a second inductor mutually coupled with the first inductor, and a tunable capacitance circuit electrically connected to the first inductor. The tunable capacitance circuit includes N switches configured to adjust effective capacitance of the tunable capacitance circuit to tune harmonic rejection of the tunable filter for at least $2\times2^N$ harmonics, where N is a positive integer greater than 1. The tunable filter is arranged to filter a radio frequency signal.

The N switches can be configured to tune provide harmonic rejection of the tunable filter for at least $3\times2^N$ harmonics.

The tunable capacitance circuit can be in parallel with the first inductor. The tunable filter can further include a capacitance in parallel with the second inductor and a shunt capacitance between the first and second inductors, in which the first inductor is in series with the second inductor.

Changing a state of a first switch of the plurality of switches can change location of at least two notches in a frequency response of the tunable filter. Changing a state of a first switch of the plurality of switches can change location of at least three notches in a frequency response of the tunable filter.

The second inductor can be a shunt inductor. The tunable capacitance circuit can be in parallel with the first inductor. The tunable filter can further include a shunt capacitor in series with the second inductor, the shunt capacitor electrically connected to the first inductor by way of the second inductor.

The $2\times2^N$ harmonics can include at least one second harmonic and at least one third harmonic. The $2\times2^N$ harmonics can include at least one harmonic associated with a fifth generation New Radio operating band. The $2\times2^N$ harmonics can include at least one harmonic associated with a fifth generation New Radio operating band and at least one harmonic associated with a fourth generation Long Term Evolution operating band.

Another aspect of this disclosure is a wireless communication device that includes a radio frequency front end including a tunable filter and an antenna in communication with the radio frequency front end. The tunable filter includes a first inductor, a second inductor mutually coupled with the first inductor, and a tunable capacitance circuit electrically connected to the first inductor. The tunable capacitance circuit includes N switches configured to adjust effective capacitance of the tunable capacitance circuit to tune harmonic rejection of the tunable filter for at least $2\times2^N$ harmonics, where N is a positive integer greater than 1. The tunable filter is arranged to filter a radio frequency signal.

The antenna can be arranged to transmit a radio frequency signal filtered by the tunable filter. N can be at least 4.

The radio frequency front end can include an antenna switch, and the tunable filter can be coupled between the antenna switch and the antenna.

The radio frequency front end can include a power amplifier and a band select switch, and the tunable filter can be coupled between the power amplifier and the band select switch.

The wireless communication device can be configured to implement dual connectivity, and the tunable filter can be configured to provide rejection for the dual connectivity. The wireless communication device can be configured to implement carrier aggregations, and the tunable filter is configured to provide rejection for the carrier aggregations.

Another aspect of this disclosure is a radio frequency system that includes an antenna switch, an antenna port, and a tunable filter coupled in a signal path between the antenna switch and the antenna port. The tunable filter includes a first inductor, a second inductor mutually coupled with the first inductor, and a tunable capacitance circuit electrically connected to the first inductor. The tunable capacitance circuit includes N switches configured to adjust effective capacitance of the tunable capacitance circuit to tune harmonic rejection of the tunable filter for at least $2\times2^N$ harmonics, where N is a positive integer greater than 1. The tunable filter is arranged to filter a radio frequency signal.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 17/351,984, filed Jun. 18, 2021 and titled "TUNABLE FILTER WITH HARMONIC REJECTION," the entire disclosure of which is hereby incorporated by reference herein.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
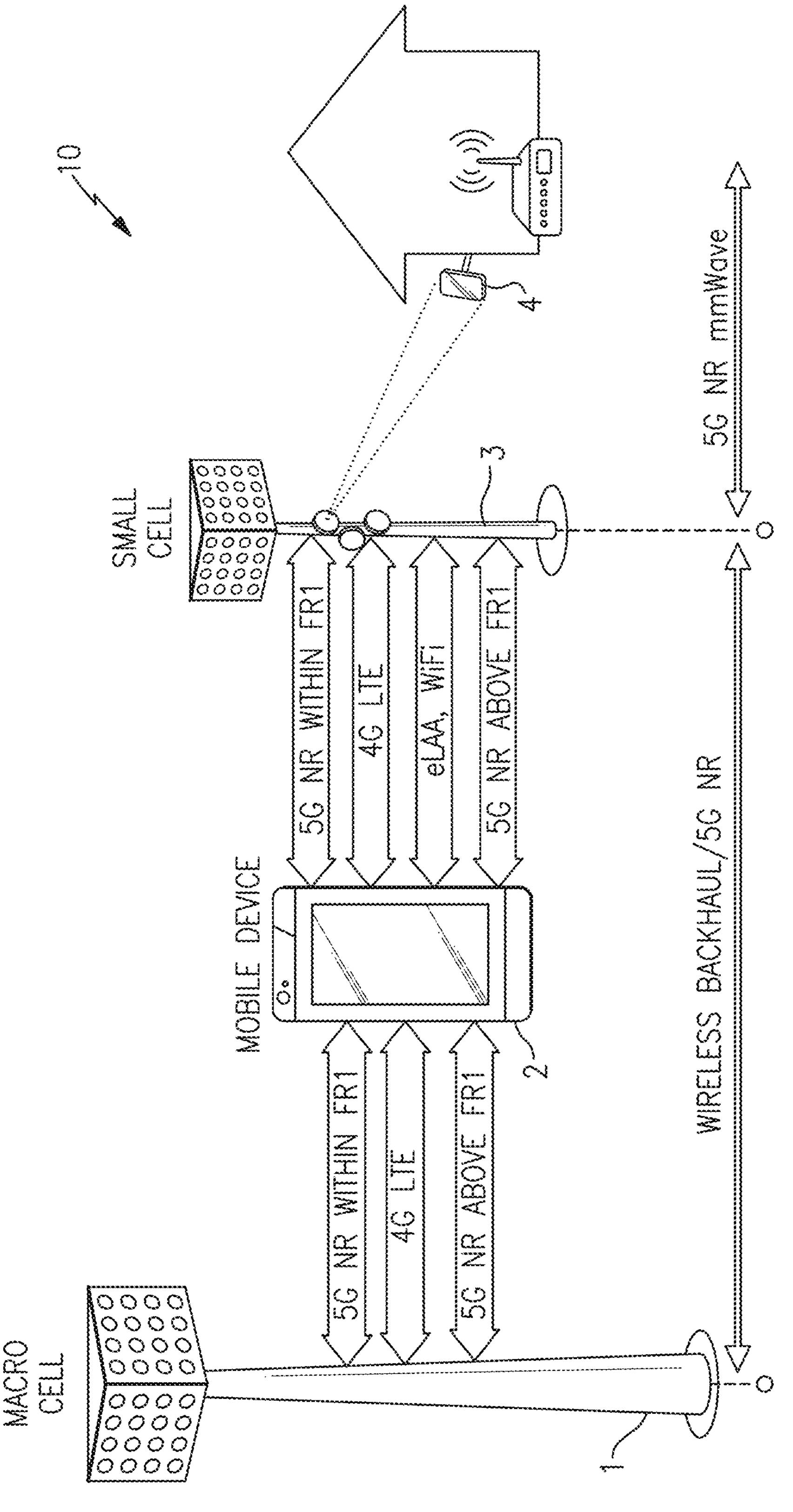
FIG. 1 is a schematic diagram of one example of a communication network.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings. The headings provided herein are for convenience only and are not intended to affect the meaning or scope of the claims.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and is currently in the process of developing Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

Harmonic Rejection

With fifth generation (5G) New Radio (NR) technology, harmonic rejection specifications can be increasingly more difficult to meet. With more integration, signals for more bands can be generated concurrently. More tunability for filters to meet various 5G NR harmonic specifications is desirable in a variety of applications. Examples of such applications include carrier aggregation applications, dual connectivity applications, applications with co-existence of a 5G NR FR1 signal and a 5G NR FR2 signal, other applications with co-existence, and the like.

Some solutions include switches to tune harmonic rejection. In such solutions, one switch can control two harmonic states, typically switching between two bands. With such technology, N switches can control up to $2^N$ harmonic states. With many bands present, a relatively large number of switches can be used to implement desired harmonic rejections. The relatively large number of switches can be costly to implement.

Aspects of this disclosure relate to filters that include mutually coupled inductors and a tunable impedance circuit. The tunable impedance circuit can include switches arranged to selectively electrically couple respective capacitors to adjust capacitance provided by the tunable impedance circuit. Using N switches together with mutually coupled inductors, a filter can realize $M\times2^N$ harmonic states, where N is a positive integer, and where M is a positive integer that is 2 or greater, and M is the number of harmonics of interest for each band. In certain applications, M can correspond to 1 more than the number of mutual couplings between inductor pairs in a tunable filter.

Filters disclosed herein advantageously use inductive mutual coupling to increase harmonic tunable states. Filters disclosed herein can reduce switch die area and/or cost for the same number of tunable harmonic states compared to previous designs.

Filters disclosed herein can filter any suitable harmonics. For example, filters disclosed herein can filter one or more of the following harmonics: second harmonic, third harmonic, fourth harmonic, fifth harmonic, sixth harmonic, etc. Such harmonics can be concurrently rejected by a filter in accordance with the principles and advantages disclosed herein.

While embodiments may be discussed with reference to harmonic rejection, any suitable principles and advantages of the filters disclosed herein can be used to provide any suitable out-of-band rejection and/or notch filtering.

Communication Network

FIG. 1 is a schematic diagram of one example of a communication network 10. The communication network 10 includes a macro cell base station 1, a mobile device 2, a small cell base station 3, and a stationary wireless device 4.

The illustrated communication network 10 of FIG. 1 supports communications using a variety of technologies, including, for example, 4G LTE, 5G NR, and wireless local area network (WLAN), such as Wi-Fi. In the communication network 10, dual connectivity can be implemented with concurrent 4G LTE and 5G NR communication with the mobile device 2. Although various examples of supported communication technologies are shown, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

As shown in FIG. 1, the mobile device 2 communicates with the macro cell base station 1 over a communication link that uses a combination of 4G LTE and 5G NR technologies. The mobile device 2 also communications with the small cell base station 3. In the illustrated example, the mobile device 2 and small cell base station 3 communicate over a communication link that uses 5G NR, 4G LTE, and Wi-Fi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed Wi-Fi frequencies).

In certain implementations, the mobile device 2 communicates with the macro cell base station 1 and the small cell base station 3 using 5G NR technology over one or more frequency bands that within Frequency Range 1 (FR1) and/or over one or more frequency bands that are above FR1. The one or more frequency bands within FR1 can be less than 6 GHz. For example, wireless communications can utilize FR1, Frequency Range 2 (FR2), or a combination thereof. In one embodiment, the mobile device 2 supports a HPUE power class specification.

The illustrated small cell base station 3 also communicates with a stationary wireless device 4. The small cell base station 3 can be used, for example, to provide broadband service using 5G NR technology. In certain implementations, the small cell base station 3 communicates with the stationary wireless device 4 over one or more millimeter wave frequency bands in the frequency range of 30 GHz to 300 GHz and/or upper centimeter wave frequency bands in the frequency range of 24 GHz to 30 GHz.

In certain implementations, the small cell base station 3 communicates with the stationary wireless device 4 using beamforming. For example, beamforming can be used to focus signal strength to overcome path losses, such as high loss associated with communicating over millimeter wave frequencies.

The communication network 10 of FIG. 1 includes the macro cell base station 1 and the small cell base station 3. In certain implementations, the small cell base station 3 can operate with relatively lower power, shorter range, and/or with fewer concurrent users relative to the macro cell base station 1. The small cell base station 3 can also be referred to as a femtocell, a picocell, or a microcell.

Although the communication network 10 is illustrated as including two base stations, the communication network 10 can be implemented to include more or fewer base stations and/or base stations of other types. As shown in FIG. 1, base stations can communicate with one another using wireless communications to provide a wireless backhaul. Additionally or alternatively, base stations can communicate with one another using wired and/or optical links.

The communication network 10 of FIG. 1 is illustrated as including one mobile device and one stationary wireless device. The mobile device 2 and the stationary wireless device 4 illustrate two examples of user devices or user equipment (UE). Although the communication network 10 is illustrated as including two user devices, the communication network 10 can be used to communicate with more or fewer user devices and/or user devices of other types. For example, user devices can include mobile phones, tablets, laptops, IoT devices, wearable electronics, and/or a wide variety of other communications devices.

User devices of the communication network 10 can share available network resources (for instance, available frequency spectrum) in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user device a unique code, space-divisional multiple access (SDMA) in which beamforming is used to provide shared access by spatial division, and non-orthogonal multiple access (NOMA) in which the power domain is used for multiple access. For example, NOMA can be used to serve multiple user devices at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user device. Ultra-reliable low latency communications (uRLLC) refers to technology for communication with very low latency, for instance, less than 2 milliseconds. uRLLC can be used for mission-critical communications such as for autonomous driving and/or remote surgery applications.

Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to eMBB, uRLLC, and/or mMTC.

A peak data rate of a communication link (for instance, between a base station and a user device) depends on a variety of factors. For example, peak data rate can be affected by channel bandwidth, modulation order, a number of component carriers, and/or a number of antennas used for communications.

For instance, in certain implementations, a data rate of a communication link can be about equal to $M*B*\log_2(1+S/N)$, where M is the number of communication channels, B is the channel bandwidth, and S/N is the signal-to-noise ratio (SNR).

Accordingly, data rate of a communication link can be increased by increasing the number of communication channels (for instance, transmitting and receiving using multiple antennas), using wider bandwidth (for instance, by aggregating carriers), and/or improving SNR (for instance, by increasing transmit power and/or improving receiver sensitivity).

5G NR communication systems can employ a wide variety of techniques for enhancing data rate and/or communication performance.

Carrier Aggregation

Figure 2A:
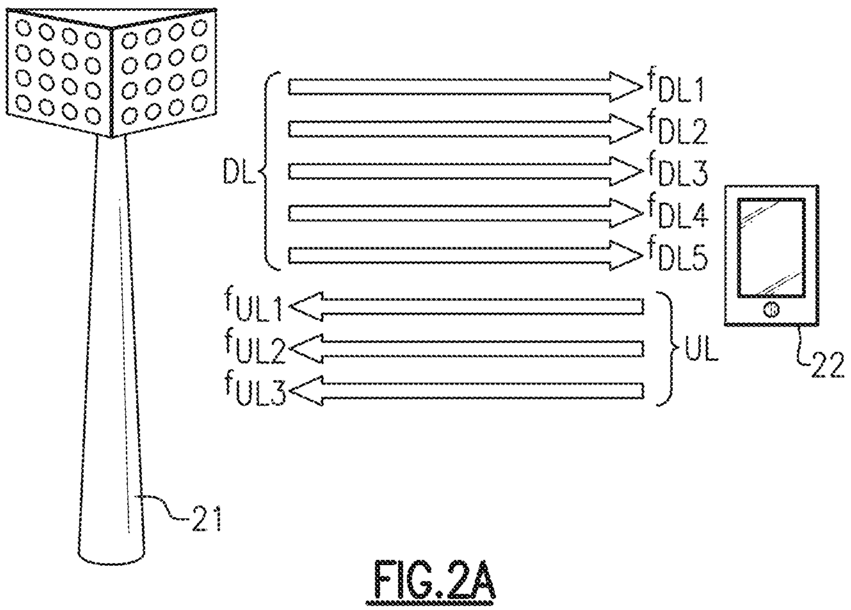
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations. Carrier aggregation can present challenges for harmonic rejection. Filters disclosed herein can be implemented to provide harmonic rejection in carrier aggregation applications. Radio frequency front end architectures disclosed herein can be implemented in dual connectivity applications.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
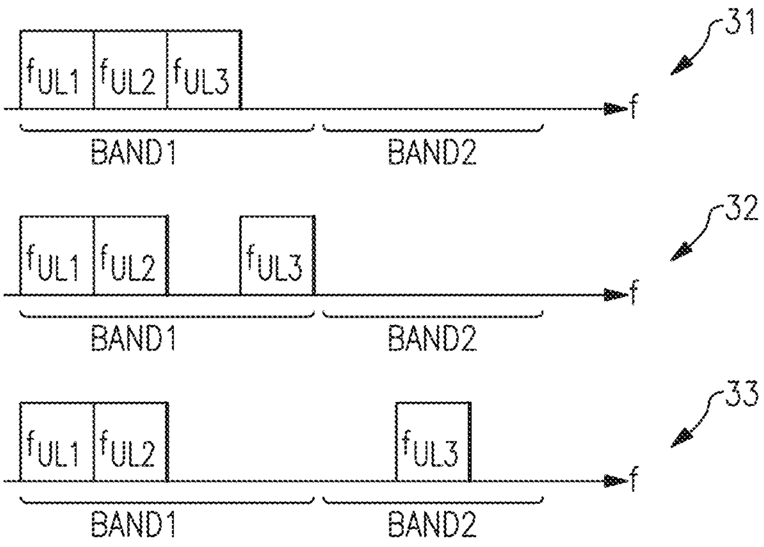
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
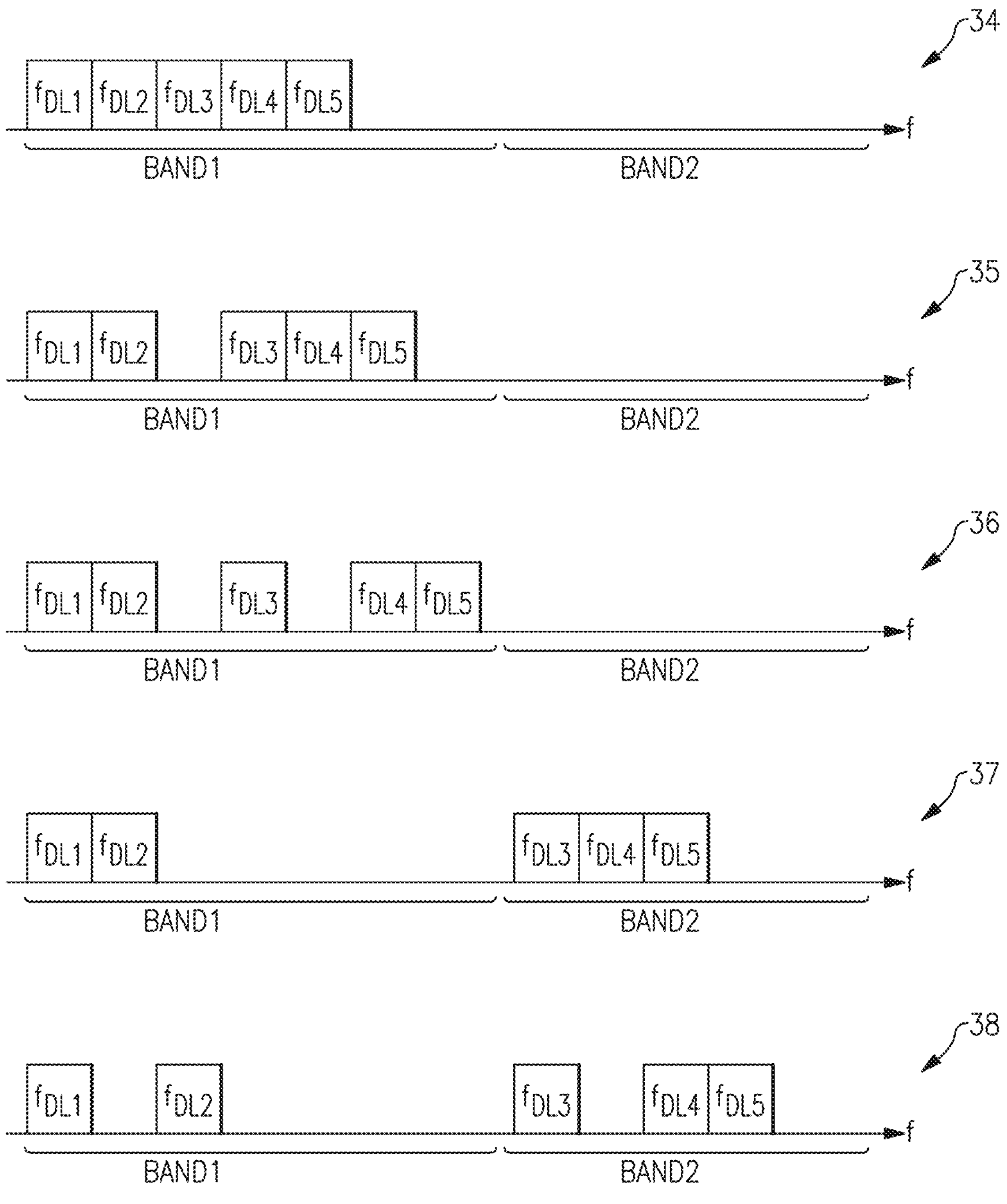
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as Wi-Fi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid Wi-Fi users and/or to coexist with Wi-Fi users. Enhanced license assisted access (eLAA) refers to an evolution of LAA that aggregates licensed and unlicensed spectrum for both downlink and uplink.

Dual Connectivity

With the introduction of the 5G NR air interface standards, 3GPP has allowed for the simultaneous operation of 5G and 4G standards in order to facilitate the transition. This mode can be referred to as Non-Stand-Alone (NSA) operation or E-UTRAN New Radio-Dual Connectivity (EN-DC) and involves both 4G and 5G carriers being simultaneously transmitted and/or received from a user equipment (UE). EN-DC can present challenges for harmonic rejection. Filters disclosed herein can be implemented to provide harmonic rejection in dual connectivity applications. Radio frequency front end architectures disclosed herein can be implemented in dual connectivity applications.

In certain EN-DC applications, dual connectivity NSA involves overlaying 5G systems onto an existing 4G core network. For dual connectivity in such applications, the control and synchronization between the base station and the UE can be performed by the 4G network while the 5G network is a complementary radio access network tethered to the 4G anchor. The 4G anchor can connect to the existing 4G network with the overlay of 5G data/control.

Figure 3:
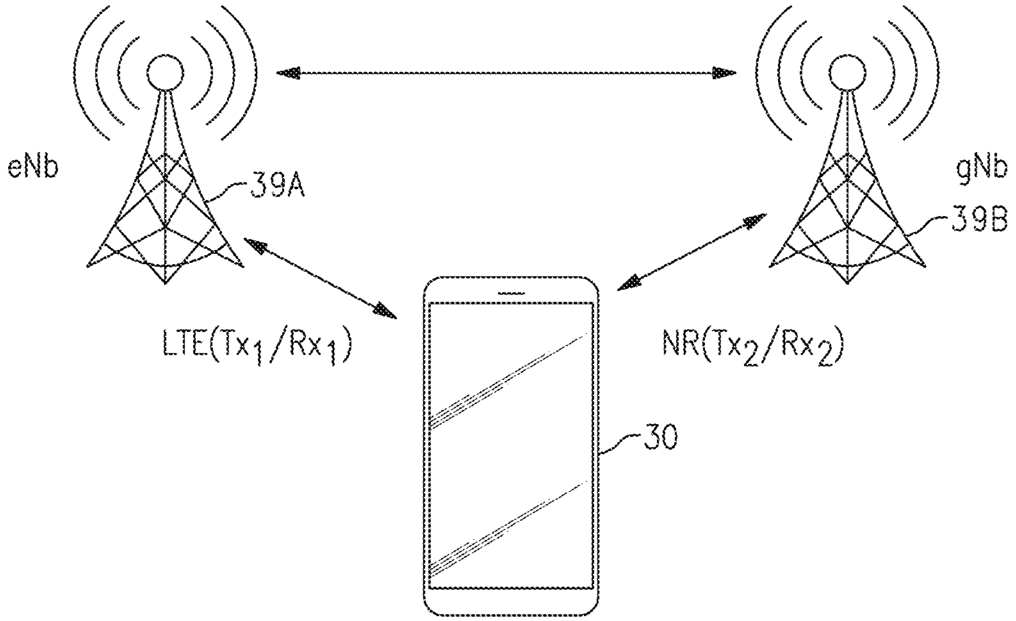
FIG. 3 is a diagram of an example dual connectivity network topology.

FIG. 3 is a diagram of an example dual connectivity network topology. This architecture can leverage LTE legacy coverage to ensure continuity of service delivery and the progressive rollout of 5G cells. A UE 30 can simultaneously transmit dual uplink LTE and NR carriers. The UE 30 can transmit an uplink LTE carrier Tx1 to the eNodeB (eNB) 39A while transmitting an uplink NR carrier Tx2 to the gNodeB (gNB) 39B to implement dual connectivity. Any suitable combination of uplink carriers Tx1, Tx2 and/or downlink carriers Rx1, Rx2 can be concurrently transmitted via wireless links in the example network topology of FIG. 3. The CNB 39A can provide a connection with a core network, such as an Evolved Packet Core (EPC). The gNB 39B can communicate with the core network via the CNB 39A. Control plane data can be wireless communicated between the UE 30 and eNB 39A. The eNB 39A can also communicate control plane data with the gNB 39B.

In the example dual connectivity topology of FIG. 3, any suitable combinations of standardized bands and radio access technologies (e.g., FDD, TDD, SUL, SDL) can be wirelessly transmitted and received. This can present technical challenges related to having multiple separate radios and bands functioning in the UE 30. With a TDD LTE anchor point, network operation may be synchronous, in which case the operating modes can be constrained to Tx1/Tx2 and Rx1/Rx2, or asynchronous which can involve Tx1/Tx2, Tx1/Rx2, Rx1/Tx2, Rx1/Rx2. When the LTE anchor is a frequency division duplex (FDD) carrier, the TDD/FDD inter-band operation can involve simultaneous Tx1/Rx1/Tx2 and Tx1/Rx1/Rx2.

Tunable Filters with Harmonic Rejection

Harmonic rejection can be implemented in a variety of tunable filters. Example embodiments of tunable filters will be discussed with reference to FIGS. 4 to 14. Any suitable combination of features of these example tunable filters can be implemented together with each other.

In 5G NR and other applications, harmonic rejection specifications can be challenging to meet. Providing additional tunability for filters can help with meeting such harmonic rejection specifications. Embodiments disclosed herein relate to filters with at least one tunable impedance circuit and mutually coupled inductors to provide tunability for a variety of harmonics. Filters with mutually coupled inductors and at least one tunable impedance circuit with one or more switches can provide harmonic rejection at more harmonics than similar filters without mutually coupled inductors. This can provide tunability for a larger number of harmonics relative to the number of switches included in a tunable impedance circuit compared to previous designs without mutually coupled inductors. In embodiments of filters disclosed herein, 2 or 3 times as many harmonic states can be achieved in a filter due to mutual inductive coupling compared to similar filters without mutual coupling. The principles and advantages disclosed herein can apply to a larger multiple of the number of harmonics relative to the number of switches included in a tunable impedance circuit. The principles and advantages disclosed herein are not limited to harmonic rejections, but can also be applied to any other out-of-band rejections and/or notch filtering as suitable.

Figure 4:
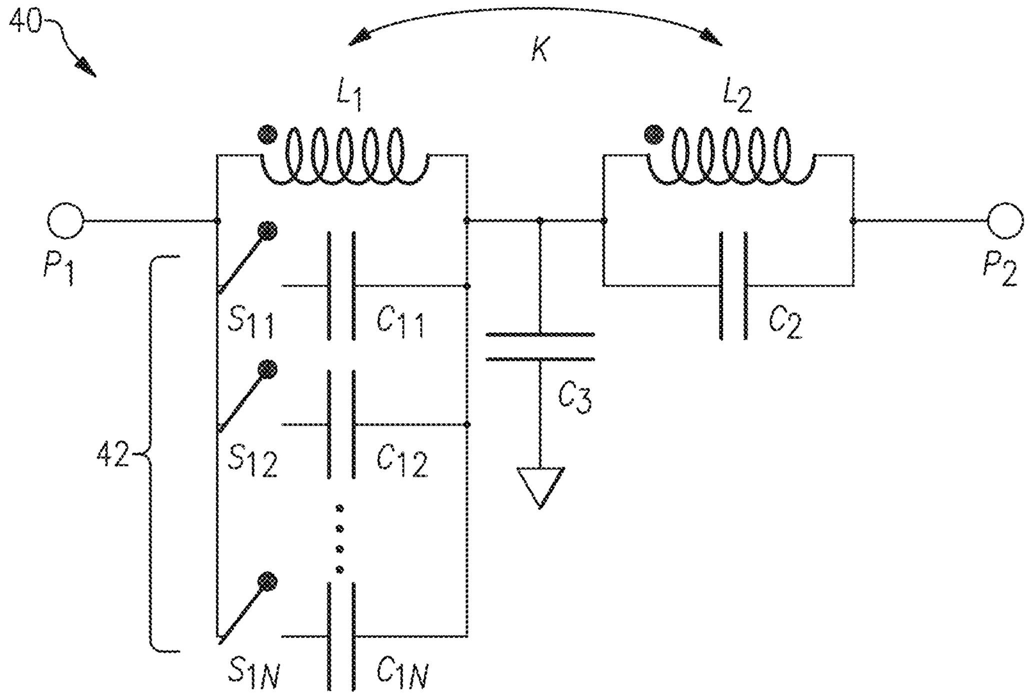
FIG. 4 is a schematic diagram of a tunable filter according to an embodiment.

FIG. 4 is a schematic diagram of a tunable filter 40 according to an embodiment. The tunable filter 40 is arranged to filter a radio frequency signal propagating between a first port $P_1$ and a second port $P_2$. The tunable filter 40 can be a low pass filter. As illustrated, the tunable filter 40 includes a tunable impedance circuit 42, inductors, and capacitors. The inductances of inductors and the capacitances of capacitors can set a frequency response of the tunable filter 40, including what frequencies are passed and where notches are present in a frequency response for harmonic rejection.

The inductors of the tunable filter 40 include a first inductor $L_1$ and a second inductor $L_2$. The first inductor $L_1$ and the second inductor $L_2$ are in series with each other. The first inductor $L_1$ and the second inductor $L_2$ are mutually coupled with each other. Mutual coupling can also be referred to as magnetic coupling or mutual inductive coupling. The first inductor $L_1$ and the second inductor $L_2$ have a coupling coefficient of K. Inductors of the tunable filter 40 and/or one or more other tunable filters disclosed herein can include any suitable inductors, such as one or more surface mount technology (SMT) inductors, one or more coils on and/or embedded in a substrate (e.g., a laminate substrate), one or more on die inductors (e.g., one or more inductors on the same die as a switch in a tunable impedance circuit), one or more integrated passive device (IPD) inductors, the like or any suitable combination thereof.

The capacitors of the tunable filter 40 include capacitors $C_{11}$, $C_{12}$, up to $C_{1N}$ of the tunable impedance circuit 42 and capacitors $C_2$ and $C_3$. Capacitors of the tunable filter 40 and/or one or more other tunable filters disclosed herein can include any suitable capacitors, such as one or more surface mount technology (SMT) capacitors, one or more on die capacitors (e.g., one or more capacitors on the same die as a switch in a tunable capacitance circuit), one or more IPD capacitors, the like, or any suitable combination thereof.

In the tunable filter 40, the tunable impedance circuit 42 is a tunable capacitance circuit. The tunable impedance circuit 42 is in parallel with the first inductor $L_1$ in the tunable filter 40. The tunable impedance circuit 42 is in series with the second inductor $L_2$ in the tunable filter 40. The tunable impedance circuit 42 includes a plurality of capacitors $C_{11}$, $C_{12}$, . . . , $C_{1N}$ each arranged in series with a respective switch $S_{11}$, $S_{12}$, . . . , $S_{1N}$. Each switch $S_{11}$, $S_{12}$, . . . , $S_{1N}$ can selectively electrically couple an end of a respective capacitor $C_{11}$, $C_{12}$, . . . , $C_{1N}$ to the first inductor $L_1$. Accordingly, each switch $S_{11}$, $S_{12}$, . . . , $S_{1N}$ can selectively electrically couple a respective capacitor $C_{11}$, $C_{12}$, . . . , $C_{1N}$ in parallel with the first inductor $L_1$. The capacitor(s) electrically coupled in parallel with the first inductor $L_1$ set an effective capacitance for a particular state of the tunable impedance circuit 42.

Although embodiments disclosed herein may include tunable capacitance circuits, any suitable principles and advantages disclosed herein can be applied to tunable impedance circuits. Such tunable impedance circuits can include tunable inductance circuits. Any suitable inductor of a filter that includes inductors and capacitors can be implemented by a tunable inductance circuit to tune harmonic rejection. Some tunable filters with harmonic rejection can include one or more tunable capacitance circuits and one or more tunable inductance circuits.

The tunable filter 40 is arranged to provide harmonic rejection. Locations of harmonic notches in a frequency response of the tunable filter 40 can be tuned based on a state of the tunable impedance circuit 42. For example, closing a switch $S_{11}$ can couple a capacitor $C_{11}$ in parallel with the first inductor $L_1$. This changes the effective capacitance provided by the tunable impedance circuit 42 and locations of notches in the frequency domain of the tunable filter 40 for harmonic rejection. With the mutually coupled inductors $L_1$ and $L_2$, toggling a switch of the tunable impedance circuit 42 can adjust locations of more notches in a frequency response than a similar filter without mutually coupled inductors.

The illustrated tunable filter 40 includes a T network. The T network includes a first parallel inductor-capacitor circuit including the first inductor $L_1$ and the tunable impedance circuit 42, a shunt capacitor $C_3$, and a second parallel inductor-capacitor circuit including the second inductor $L_2$ and capacitor $C_2$. Any suitable principles and advantages disclosed herein can be applied to any other suitable filter topologies.

Figure 5:
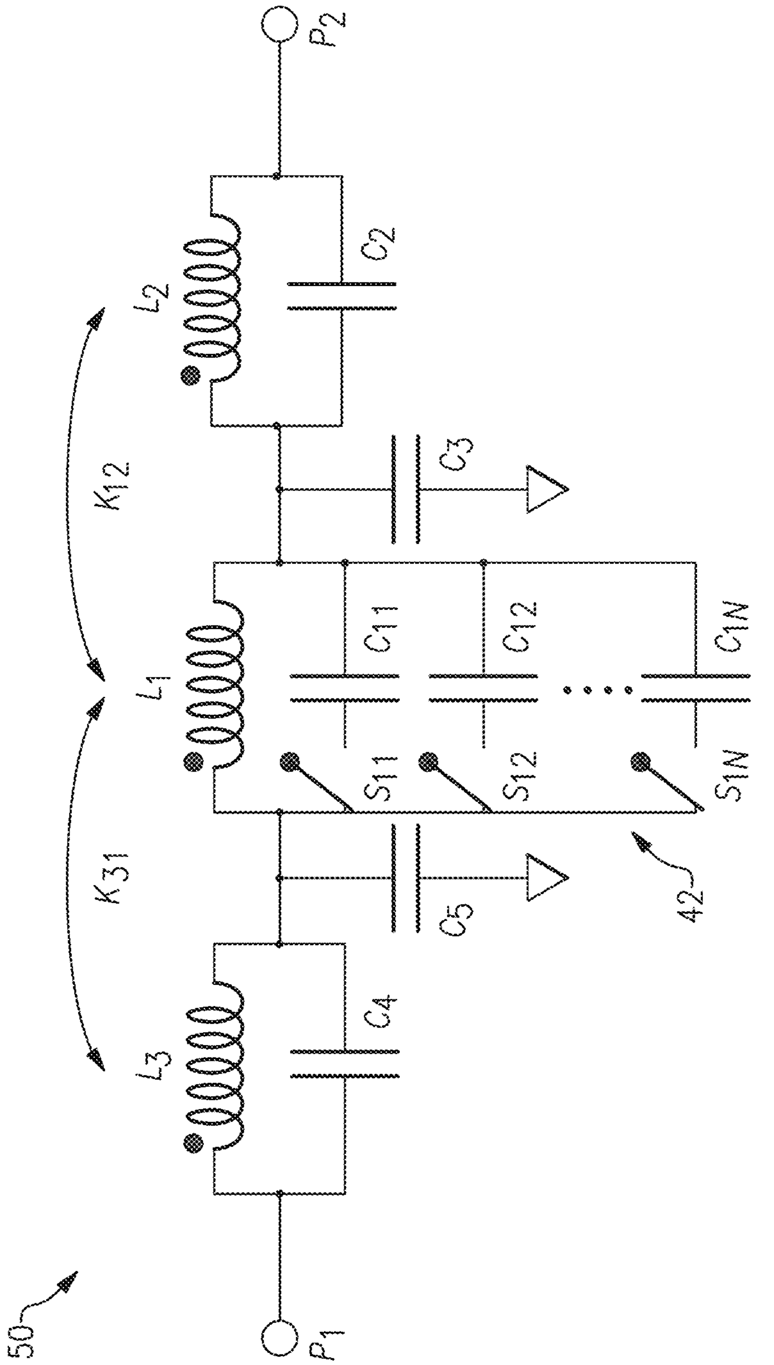
FIG. 5 is a schematic diagram of a tunable filter according to another embodiment.

FIG. 5 is a schematic diagram of a tunable filter 50 according to an embodiment. The tunable filter 50 is like the tunable filter 40 of FIG. 4 except that an additional parallel inductor-capacitor circuit and an additional shunt capacitor are included. The additional parallel inductor-capacitor circuit includes a third inductor $L_3$ and a capacitor $C_4$. The additional shunt capacitor $C_5$ is coupled between the additional inductor-capacitor circuit and the first inductor $L_1$. As shown in FIG. 5, the first inductor $L_1$ is mutually coupled to both the second inductor $L_2$ and the third inductor $L_3$. The first inductor $L_1$ and the second inductor $L_2$ have a coupling coefficient of $K_{12}$. The first inductor $L_1$ and the third inductor $L_3$ have a coupling coefficient of $K_{31}$. Changing the state of a switch of the tunable impedance 42 in the tunable filter 50 can change the location of three notches corresponding to harmonics in a frequency response of the tunable filter 50 with the mutual inductive coupling of the tunable filter 50.

Figure 6:
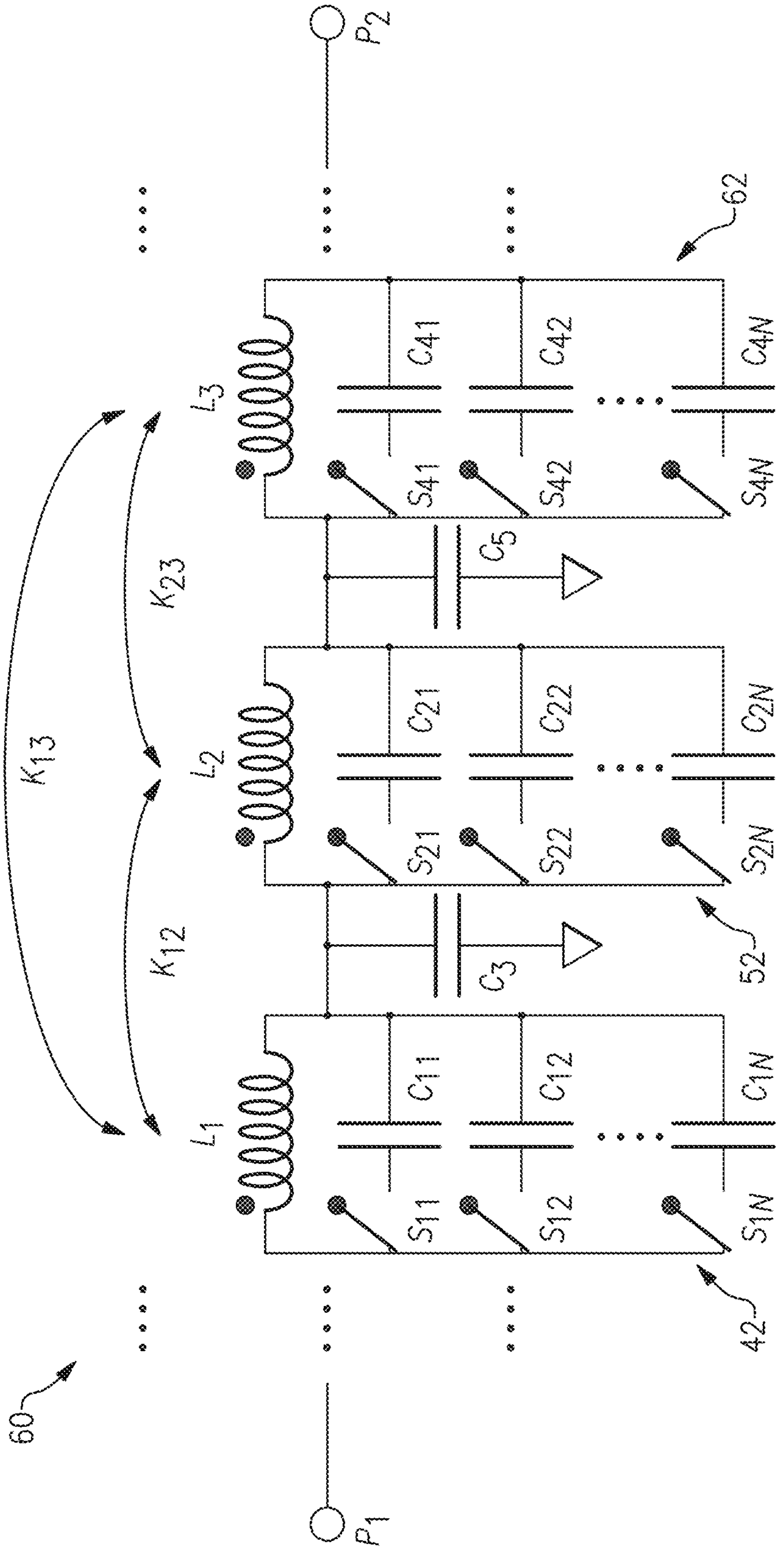
FIG. 6 is a schematic diagram of a tunable filter according to another embodiment.

FIG. 6 is a schematic diagram of a tunable filter 60 according to an embodiment. The tunable filter 60 is like the tunable filter 50 of FIG. 5 except that each parallel inductor-capacitor circuit includes a respective tunable impedance circuit and the inductors are each mutually coupled to each other. Although FIG. 6 includes three parallel inductor-capacitor circuits, any suitable number of inductor-capacitor circuits can be implemented.

As illustrated in FIG. 6, tunable impedance circuits 42, 52, and 62 are each arranged in parallel with a respective inductor $L_1$, $L_2$, $L_3$. These tunable impedance circuits 42, 52, and 62 can each adjust an effective capacitance in parallel with a respective inductor $L_1$, $L_2$, $L_3$.

The tunable impedance circuit 52 is in parallel with the second inductor $L_2$ in the tunable filter 60. The tunable impedance circuit 52 includes a plurality of capacitors $C_{21}$, $C_{22}$, . . . , $C_{2N}$ each arranged in series with a respective switch $S_{21}$, $S_{22}$, . . . , $S_{2N}$. Each switch $S_{21}$, $S_{22}$, . . . , $S_{2N}$ can selectively electrically couple a respective capacitor $C_{21}$, $C_{22}$, . . . , $C_{2N}$ to the second inductor $L_2$. Accordingly, each switch $S_{21}$, $S_{22}$, . . . , $S_{2N}$ can selectively electrically couple a respective capacitor $C_{21}$, $C_{22}$, . . . , $C_{2N}$ in parallel with the second inductor $L_2$.

The tunable impedance circuit 62 is in parallel with the third inductor $L_3$ in the tunable filter 60. The tunable impedance circuit 62 includes a plurality of capacitors $C_{41}$, $C_{42}$, . . . , $C_{4N}$ each arranged in series with a respective switch $S_{41}$, $S_{42}$, . . . , $S_{4N}$. Each switch $S_{41}$, $S_{42}$, . . . , $S_{4N}$ can selectively electrically couple a respective capacitor $C_{41}$, $C_{42}$, . . . , $C_{4N}$ to the third inductor $L_3$. Accordingly, each switch $S_{41}$, $S_{42}$, . . . , $S_{4N}$ can selectively electrically couple a respective capacitor $C_{41}$, $C_{42}$, . . . , $C_{4N}$ in parallel with the third inductor $L_3$.

In the tunable filter 60, the first inductor $L_1$ and the second inductor $L_2$ have a coupling coefficient of $K_{12}$, the second inductor $L_2$ and the third inductor $L_3$ have a coupling coefficient of $K_{23}$, and the first inductor $L_1$ and the third inductor $L_3$ have a coupling coefficient of $K_{13}$. The inductors $L_1$ and $L_3$ being mutually coupled to each other provides is additional mutual coupling in the tunable filter 60 relative to the tunable filter 50.

Figure 7:
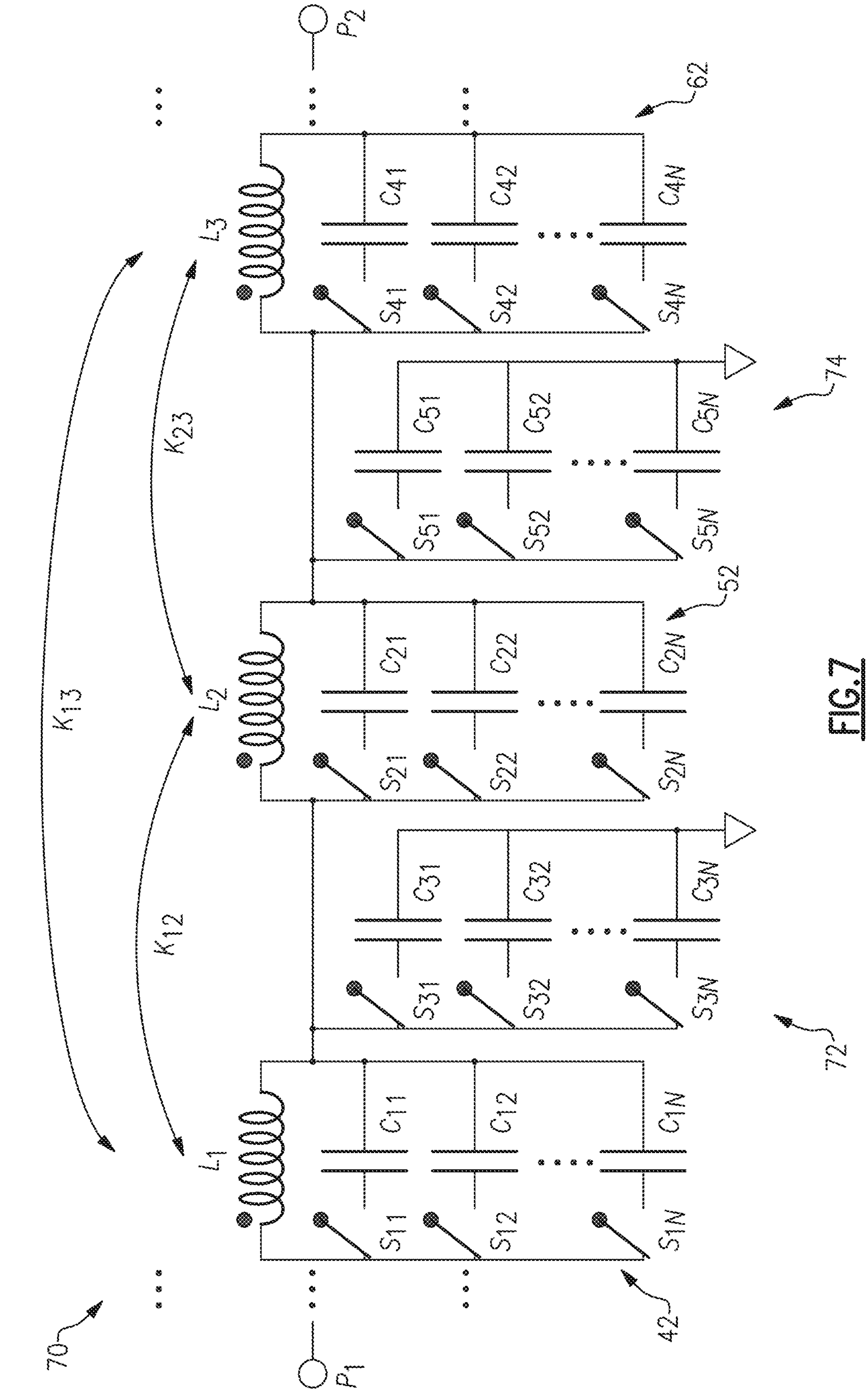
FIG. 7 is a schematic diagram of a tunable filter according to another embodiment.

FIG. 7 is a schematic diagram of a tunable filter 70 according to an embodiment. The tunable filter 70 is like the tunable filter 60 of FIG. 6 except that the shunt capacitors $C_3$ and $C_5$ are implemented by tunable impedance circuits 72 and 74, respectively. FIG. 7 illustrates that the principles and advantages disclosed herein be applied to higher order filters.

The tunable impedance circuit 72 includes a plurality of capacitors $C_{31}, C_{32}, \ldots, C_{3N}$ each arranged in series with a respective switch $S_{31}, S_{32}, \ldots, S_{3N}$. Each switch $S_{31}, S_{32}, \ldots, S_{3N}$, can selectively electrically couple a respective capacitor $C_{31}, C_{32}, \ldots, C_{3N}$ to a node between the first inductor $L_1$ and the first inductor $L_2$. Accordingly, each switch $S_{31}, S_{32}, \ldots, S_{3N}$ can selectively electrically couple a respective capacitor $C_{31}, C_{32}, \ldots, C_{3N}$ in shunt.

The tunable impedance circuit 74 includes a plurality of capacitors $C_{51}, C_{52}, \ldots, C_{5N}$ each arranged in series with a respective switch $S_{51}, S_{52}, \ldots, S_{5N}$. Each switch $S_{51}, S_{52}, \ldots, S_{5N}$ can selectively electrically couple a respective capacitor $C_{51}, C_{52}, \ldots, C_{5N}$ to a node between the second inductor $L_2$ and the third inductor $L_3$. Accordingly, each switch $S_{51}, S_{52}, \ldots, S_{5N}$ can selectively electrically couple a respective capacitor $C_{51}, C_{52}, \ldots, C_{5N}$ between the node and ground.

FIG. 7 illustrates that series and/or shunt capacitors can be implemented by tunable impedance circuits. In certain applications, one or more capacitors of a filter can be implemented by one or more tunable capacitance circuits while one or more capacitors of the filter can be implemented by a fixed capacitor that is not tunable. Any suitable capacitor of a tunable filter can be implemented by a tunable capacitance circuit in accordance with any suitable principles and advantages disclosed herein. Alternatively or additionally, any suitable inductor of a tunable filter can be implemented by a tunable inductance circuit in accordance with any suitable principles and advantages disclosed herein. Adjusting capacitance and/or inductance with a tunable impedance circuit can tune harmonic rejection of a tunable filter.

Figure 8A:
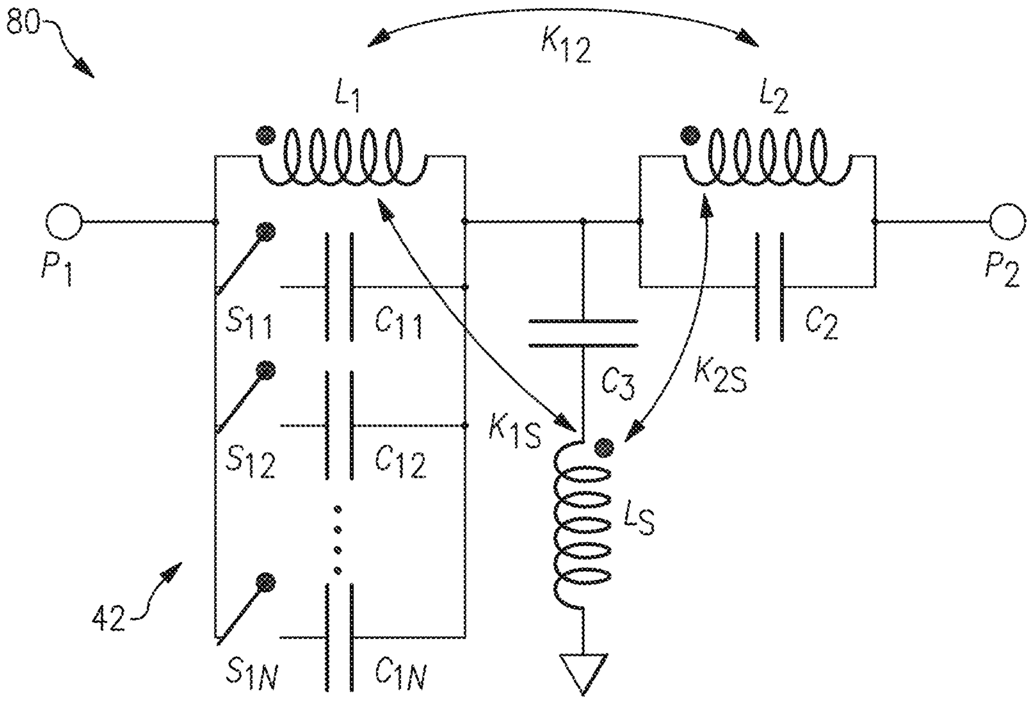
FIG. 8A is a schematic diagram of a tunable filter according to another embodiment.

In certain applications, inductor(s) can be included in series with a shunt capacitor(s) to form one or more harmonic traps. Such a shunt inductor can be mutually coupled with one or more series inductors. FIG. 8A illustrates an example of a shunt inductor arranged in series with a shunt capacitor, in which the shunt inductor is mutually coupled to series inductors.

FIG. 8A is a schematic diagram of a tunable filter 80 according to an embodiment. The tunable filter 80 is like the tunable filter 40 of FIG. 4 except that a shunt inductor $L_S$ is included in series with the shunt capacitor $C_3$. The shunt inductor $L_S$ is mutually coupled with the first inductor $L_1$. and the second inductor $L_2$. The first inductor $L_1$ and the shunt inductor $L_S$ have a coupling coefficient of $K_{1S}$. The second inductor $L_2$ and the shunt inductor $L_S$ have a coupling coefficient of $K_{2S}$.

Figure 8B:
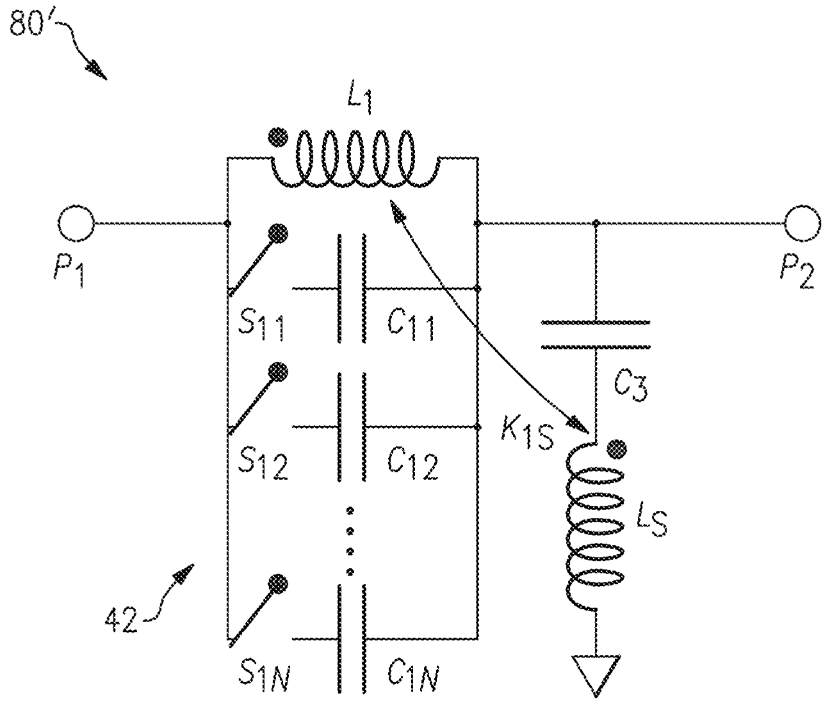
FIG. 8B is a schematic diagram of a tunable filter according to another embodiment.

FIG. 8B is a schematic diagram of a tunable filter 80' according to an embodiment. The tunable filter 80' is like the tunable filter 80 of FIG. 8A except that second inductor $L_2$ and the second capacitor $C_2$ are not included. The tunable filter 80' is equivalent to the second inductor $L_2$ having an impedance of 0 and the second capacitor $C_2$ having an impedance of 0 in the tunable filter 80. In the tunable filter 80, the second inductor $L_2$ and the second capacitor $C_2$ each have non-zero impedances.

Figure 8C:
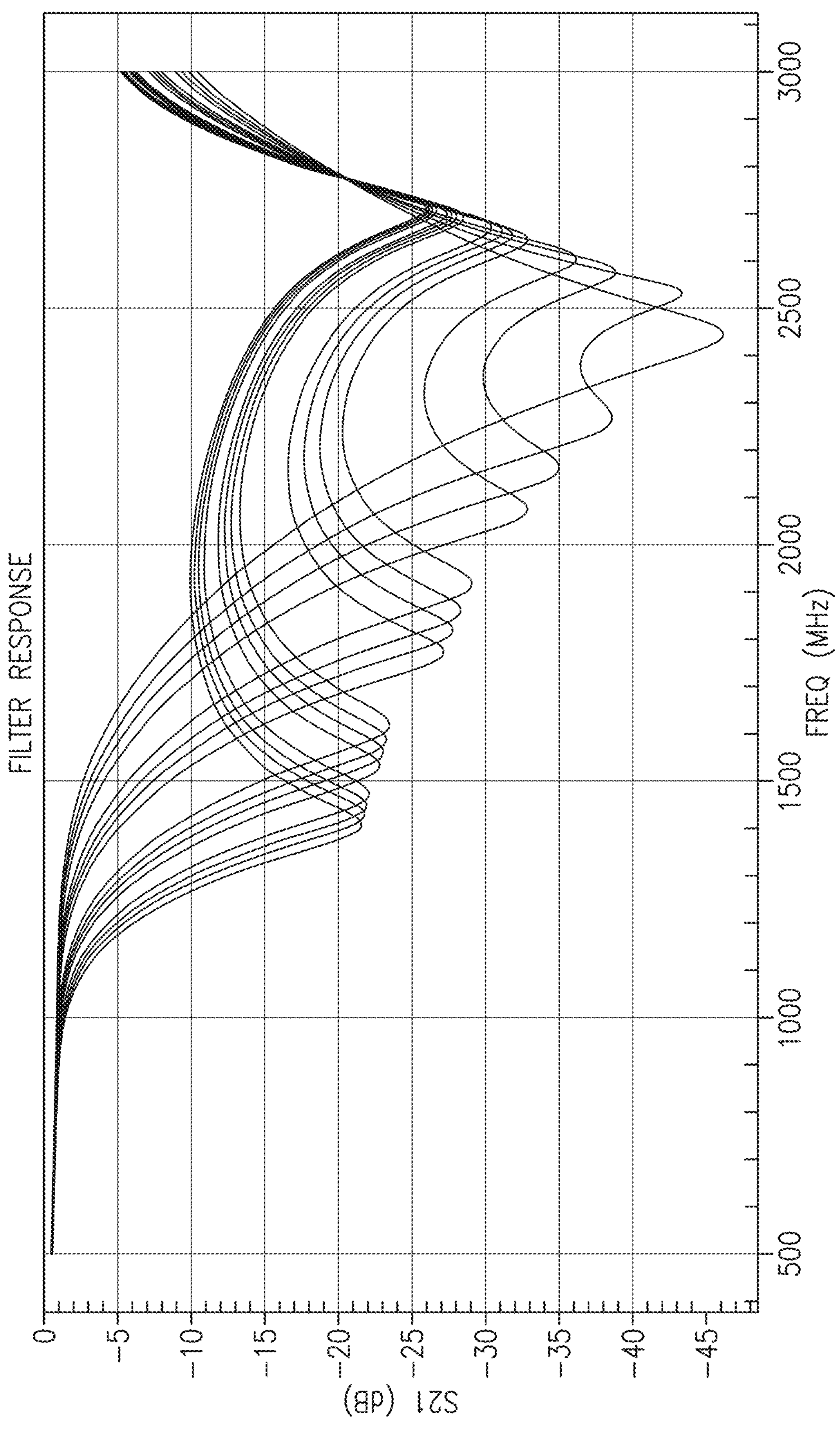
FIG. 8C is a graph of a frequency response of the filter of FIG. 8B.

FIG. 8C is a graph of a frequency response of the tunable filter 80' of FIG. 8B. The graph corresponds to the tunable filter 80' including a tunable capacitance circuit with four switches $S_{11}$, $S_{12}$, $S_{13}$, and $S_{14}$ each in series with a respective capacitor $C_{11}$, $C_{12}$, $C_{13}$, and $C_{14}$. As an example, the tunable filter 80' with the frequency response shown in FIG. 8C can provide the following harmonic rejections: Band 8 second harmonic, Band 8 third harmonic, Band 12 third harmonic, Band 13/Band 14 second harmonic, Band 20/Band 26 third harmonic, Band 28 second harmonic, Band 28 third harmonic, and Band 71 third harmonic. The tunable filter 80' corresponding to the frequency response in FIG. 8C is designed to move two notches in opposite directions when the effective capacitance C1 of the tunable capacitance circuit 42 is switched for covering the harmonic specifications.

Figure 9:
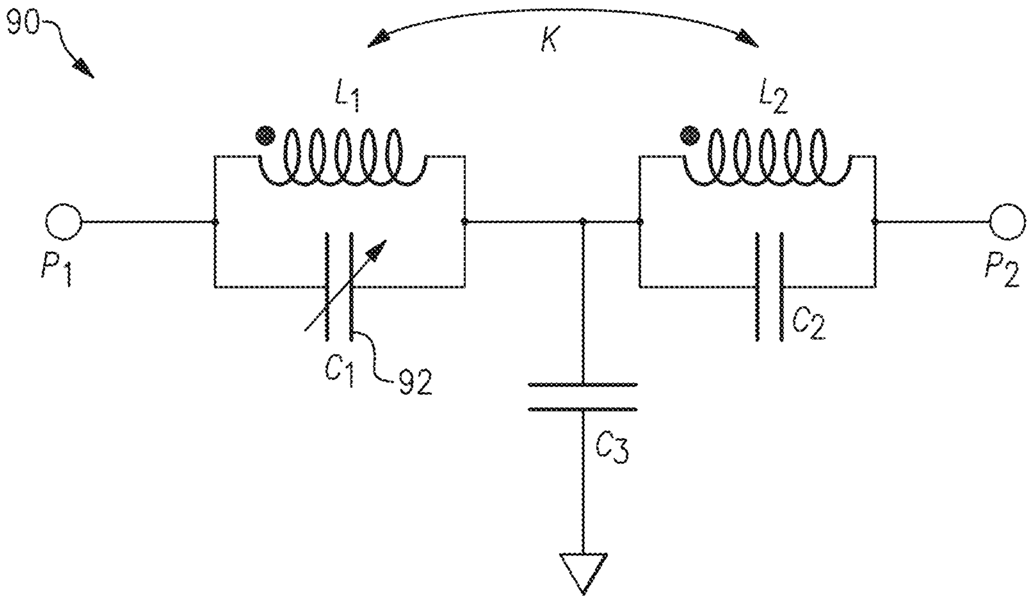
FIG. 9 is a schematic diagram of a tunable filter according to an embodiment.

FIG. 9 is a schematic diagram of a tunable filter 90 according to an embodiment. The tunable filter 90 is like the tunable filter 40 of FIG. 4 except that the tunable filter 90 has a tunable impedance circuit 92 instead of the tunable impedance circuit 42. The tunable impedance circuit 92 provides an effective capacitance C1. The tunable impedance circuit 92 can be any suitable tunable impedance circuit arranged to adjust a capacitance that is in parallel with the first inductor $L_1$. As one example, the tunable impedance circuit 92 can be the tunable impedance circuit 42. As another example, the tunable impedance circuit 92 can be a tunable impedance circuit that includes a varactor that changes capacitance based on an applied voltage. Example technical explanations and embodiments will be discussed with reference to FIG. 9.

Without being bound by theory, a theoretical explanation of the tunable filter 90 will be discussed. For an in-band design, $\omega_c$ is center angular frequency. Neglecting capacitances of the first capacitor $C_1$ and the second capacitor $C_2$, assuming for both ports $P_1$ and $P_2$ of the tunable filter 90 that $Z_0=50\Omega$, and inductances of the first and second inductors $L_1$ and $L_2$ are both equal to L, then capacitance $C_3$ of the third capacitor $C_3$ according to Equation 1 corresponds to a simultaneous conjugate match.

$$C_3 = \frac{2(L+M)}{Z_0^2 + \omega_C^2(L^2 - M^2)} \quad \text{Equation 1}$$

Harmonic notches ω can be found according to Equation 2.

$$\omega_{\pm} = \sqrt{\frac{2}{\alpha \pm \sqrt{\alpha^2 - 4\beta^2}}} \quad \text{Equation 2}$$

$$\alpha = L_1C_1 + L_2C_2 - MC_3$$

$$\beta = \sqrt{C_1C_2(L_1L_2 - M^2)}$$

$$M = K\sqrt{L_1L_2}$$

By choosing a proper coupling coefficient K for first and second inductors $L_1$ and $L_2$, respectively, the capacitance of the first capacitor $C_1$ (and/or the second capacitor $C_2$ and/or the third capacitor $C_3$) can be tuned to adjust both harmonic notches to desired frequencies. Alternatively or additionally, the inductance of the first inductor $L_1$ and/or the inductance of the second inductor $L_2$ can be tuned to adjust both harmonic notches to desired frequencies. The inductor-capacitor tanks of the tunable filter 90 can also be designed to resonate at some other frequencies, and thus the notches can be at frequencies other than multiples of fundamental frequency.

We define $\sigma$ according to Equation 3.

$$\sigma = 1 - \left(\frac{1-\delta}{1+\delta}\right)^2 \quad \text{Equation 3}$$

$$\text{where } 0 \le \delta = \left(\frac{\omega_+}{\omega_-}\right)^2 \le 1.$$

When $\delta=0$, the two notches are infinitely apart. When $\delta=1$, the two notches overlap. The function $\sigma(\delta)$ is a monotonically increasing smooth function with the same domain and range of [0, 1].

From the equations of $\omega_\pm$, it follows that:

$$\sigma = \frac{4\beta^2}{\alpha^2} = \frac{4C_1C_2(L_1L_2 - M^2)}{(L_1C_1 + L_2C_2 - MC_3)^2} \quad \text{Equation 4}$$

Suppose we have fixed capacitances for the second and third capacitors $C_2$, $C_3$ and fixed inductances for the first and second inductors $L_1$, $L_2$, then capacitance of the first capacitor $C_1$ and the mutual coupling M between the first and second inductors $L_1$, $L_2$ remain as design variables. When the capacitance of the first capacitor $C_1=0$, we have $\sigma=\delta=0$ from Equation 4. Seeking a solution for $\sigma=1$, we have:

$$(L_1C_1 + L_2C_2 - MC_3)^2 - 4C_1C_2(L_1L_2 - M^2) = 0 \quad \text{Equation 5}$$

This can be re-written as:

$$L_1^2C_1^2 + (4C_2M^2 - 2C_2L_1L_2 - 2C_3L_1M)C_1 + (L_2C_2 - MC_3)^2 = 0 \quad \text{Equation 6}$$

Assuming $M^2 << L_1L_2$ for a second order approximation, we have the discriminant of Equation 6 as:

$$\Delta \approx 16L_1^2L_2MC_2C_3 \ge 0 \text{ if } M \ge 0 \quad \text{Equation 7}$$

This implies that by choosing the proper M, we can design $$\delta = \left(\frac{\omega_+}{\omega_-}\right)^2$$

to be any value from 0 to 1. Accordingly, notches can theoretically be located at any location in the frequency domain relative to each other.

Assuming that $\sigma$ from Equation 3 is fixed, for any capacitance of the second capacitor $C_2$, the mutual coupling M and capacitance of the first capacitor $C_1$ can be determined.

From Equation 4, we have:

$$\sigma(L_1C_1 + L_2C_2 - MC_3)^2 = 4C_1C_2(L_1L_2 - M^2) \quad \text{Equation 8}$$

Equation 8 can be re-written as:

$$\sigma L_1^2C_1^2 + (2\sigma L_1(L_2C_2 - MC_3) - 4C_2(L_1L_2 - M^2))C_1 + \sigma(L_2C_2 - MC_3)^2 = 0 \quad \text{Equation 9}$$

If the capacitance of the first capacitor $C_1$ is unknown, Equation 9 has the discriminant (assuming $M^2 << L_1L_2$) as follows:

$$\Delta \approx 16L_1^2L_2C_2[(1-\sigma)L_2C_2 + MC_3] \quad \text{Equation 10}$$

As long as M is chosen such that $(1-\sigma)L_2C_2 > -MC_3$, there will be 2 (positive) solutions for the capacitance of the first capacitor $C_1$ to meet the specified o. The two solutions can be found from Equation 11:

$$C_{1\pm} = -C_2[2M^2 - (2-\sigma)L_1L_2] + C_3L_1M\sigma + \quad \text{Equation 11}$$
$$2\sqrt{C_2(L_1L_2 - M^2)\{C_2[(1-\sigma)L_1L_2 - M^2] + C_3L_1M\sigma\}}$$

In practice, if the capacitance of the first capacitor $C_1$ is changed from $C_{1-}$ to $C_{1+}$, we can expect $$\frac{\omega_+}{\omega_-}$$

to remain fairly constant. This is consistent with variation analysis described below.

With $$\sigma = \frac{4\gamma}{\alpha^2},\ \gamma = C_1C_2(L_1L_2 - M^2),\ \alpha = L_1C_1 + L_2C_2 - MC_3,$$

the following derivatives can be determined:

$$d\sigma = \left(\frac{4\partial\gamma}{\partial C_1}\alpha^{-2} - \frac{8\alpha^{-3}\gamma\partial\alpha}{\partial C_1}\right)dC_1$$

$$\frac{d\sigma}{\sigma} = \frac{\alpha^2}{4\gamma}\left(\frac{4\partial\gamma}{\partial C_1}\alpha^{-2} - \frac{8\alpha^{-3}\gamma\partial\alpha}{\partial C_1}\right)dC_1 = \left(\frac{\partial\gamma}{\gamma\partial C_1} - \frac{2\partial\alpha}{\alpha\partial C_1}\right)dC_1$$

$$\frac{\partial\gamma}{\partial C_1} = C_2(L_1L_2 - M^2)$$

$$\frac{\partial\alpha}{\partial C_1} = L_1$$

$$\frac{d\sigma}{\sigma} = \left(1 - \frac{2L_1C_1}{L_1C_1 + L_2C_2 - MC_3}\right)\frac{dC_1}{C_1}$$

$$\frac{d\delta}{\delta} = \frac{1}{\sqrt{1-\sigma}}\frac{d\sigma}{\sigma} = \frac{2dr}{r},\ r = \frac{\omega_+}{\omega_-},\ \frac{d\sigma}{\sigma} = \frac{d\delta}{\delta}\frac{1-\delta}{1+\delta}$$

Accordingly, if $$1 \ge \frac{2L_1C_1}{L_1C_1 + L_2C_2 - MC_3},$$

then the two notches would shift down together by increasing capacitance of the first capacitor $C_1$. In addition, if $$\left(1 - \frac{2L_1C_1}{L_1C_1 + L_2C_2 - MC_3}\right) > 0$$

but close to 0, we expect σ (or δ) to change very little if we sweep capacitance of the first capacitor $C_1$ from $C_{1-}$ to $C_{1+}$. Furthermore, if $$1 < \frac{2L_1C_1}{L_1C_1 + L_2C_2 - MC_3},$$

increasing $C_1$ should shift down $\omega_+$, while $\omega_-$ could shift up or down. The case of the two notches shifting in opposite directions in the frequency domain can be implemented in variety of applications for providing out-of-band rejections.

Figure 10:
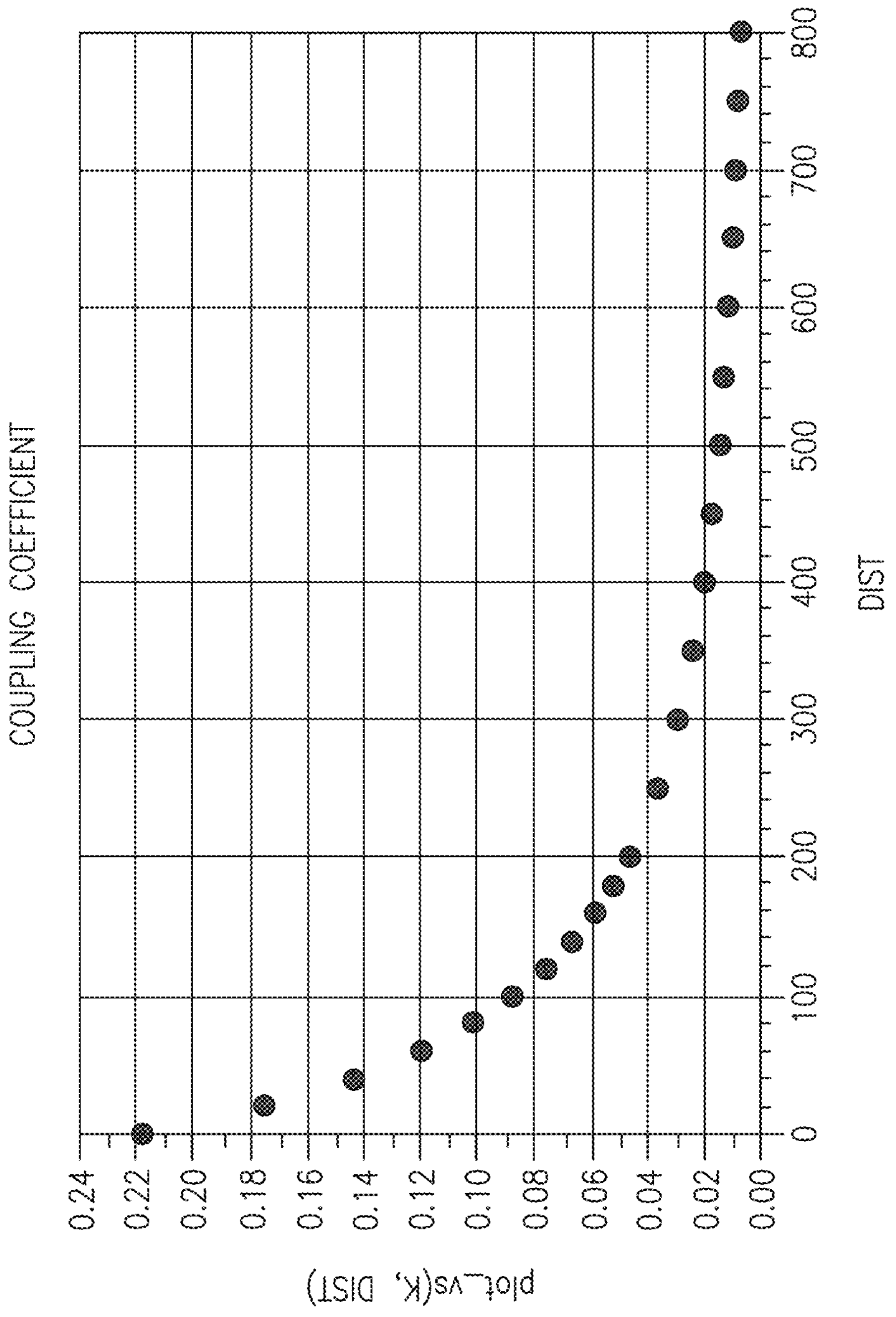
FIG. 10 is a graph of coupling coefficient versus distance between the two mutually coupled inductors.

The coupling coefficient of the first inductor $L_1$ and the second inductor $L_2$ of the tunable filter 90 was investigated. FIG. 10 is a graph of coupling coefficient versus distance between the first inductor $L_1$ and the second inductor $L_2$. The mutual coupling of inductors can be realized using two relatively closely placed SMT inductors. As another example, mutual coupling of inductors can be realized with two properly aligned embedded coils in a laminate or on a die. FIG. 10 is a plot of the magnitude of the coupling coefficient an embodiment of the first inductor $L_1$ and the second inductor $L_2$ of the tunable filter 90 where the first inductor $L_1$ and the second inductor $L_2$ each had an inductance of 2.7 nano-Henry (nH). FIG. 10 indicates that physical layout of inductors affects mutual coupling, and specifically distance between inductors can affect mutual coupling. The geometry of the mutually coupled inductors can also impact mutual coupling.

Coupling coefficient also typically depends on polarity of the mutually coupled inductors. By switching polarity of one mutually coupled inductor, the sign of the coupling coefficient can be switched (e.g., from positive to negative, or from negative to positive). The dots of the inductors illustrated in the drawings indicate polarity of these inductors.

A first design example of the tunable filter 90 of FIG. 9 will now be discussed. In this example, the tunable filter 90 has two working frequencies (1 GHz and 0.9 GHz) by switching to two different effective capacitance values of the tunable impedance circuit 92. Each state has 2fo rejection>25 Decibel (dB) and 3fo rejection>35 dB, where 2fo rejection is second harmonic rejection and 3fo rejection is third harmonic rejection. The first and second inductors $L_1$ and $L_2$ are assumed to have a constant quality factor (Q) of 20 in this example. The tunable impedance circuit 92 is adjustable and/or switchable so that a first effective capacitance $C_{1A}$ is provided when operating at 1 GHz and a second effective capacitance $C_{1B}$ is provided when operating at 0.9 GHz. For achieving these performance specifications, the tunable filter 90 can include components with the values shown in Table 1 below.

TABLE 1

| | L1 | C1A | C1B | L2 | C2 | C3 | K |
|---|---|---|---|---|---|---|---|
| Value | 3 nH | 1.31 pF | 1.99 pF | 3 nH | 1.41 pF | 1.87 pF | −0.11 |

Figure 11:
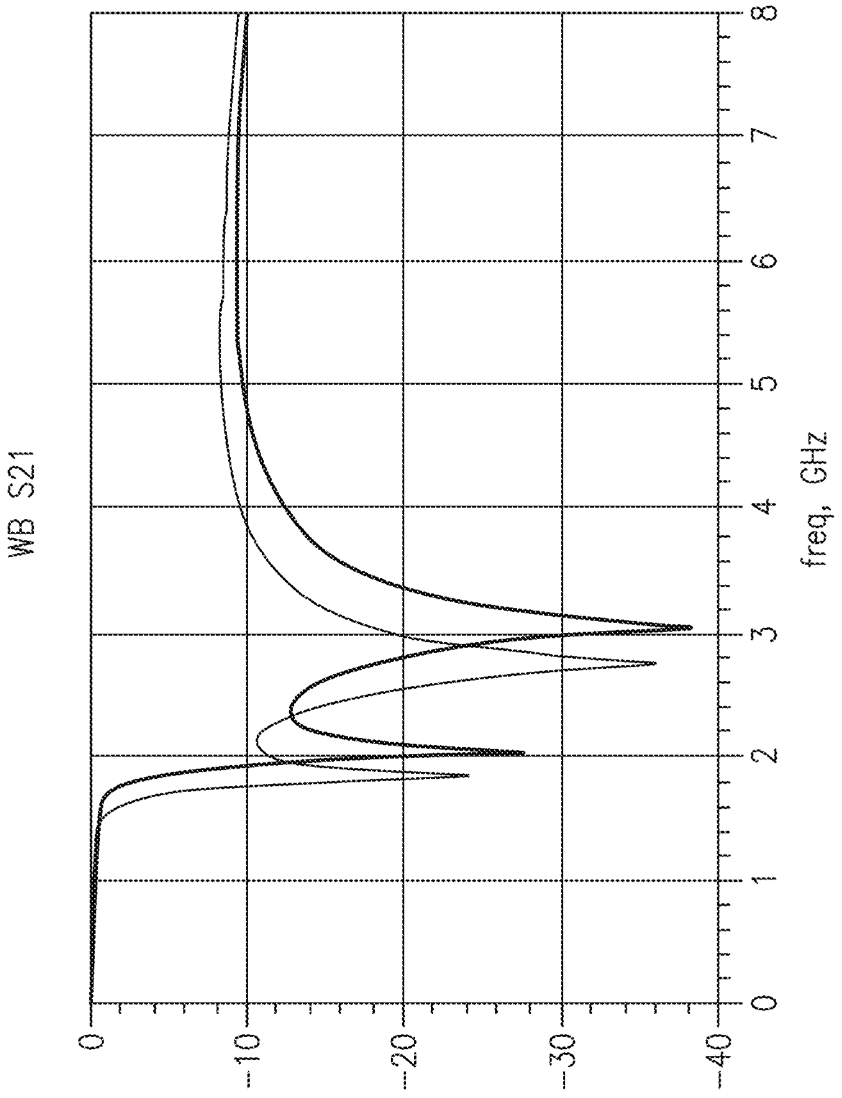
FIG. 11 is a graph of a simulation showing the locations of harmonic notches of the tunable filter of FIG. 9 according to a first design example.

FIG. 11 is a graph of a simulation showing the locations of the harmonic notches of the tunable filter 90 of FIG. 9 designed according to the first design example. A first curve in FIG. 11 shows locations of notches for second and third harmonics for operating at 1 GHz. A second curve in FIG. 11 shows locations of notches for second and third harmonics for operating at 0.9 GHz. These curves show locations of two notches in a frequency response of the tunable filter 90 changing by changing the effective capacitance of the tunable impedance circuit 92 for two different working frequencies. Accordingly, when the tunable impedance circuit 92 includes a switch arranged to selectively electrically couple an end of a capacitor to the first inductor $L_1$ to change state of the tunable impedance circuit 92, changing the state of the switch can change the location of two notches in the frequency response of the tunable filter 90.

A second design example of the tunable filter 90 of FIG. 9 will now be discussed. In this example, the tunable filter 90 has three working frequencies (1 GHz, 0.9 GHz, and 0.8 GHz) by switching to three different effective capacitance values of the tunable impedance circuit 92. Each state has 2fo rejection>25 dB and 3fo rejection>35 dB. The inductors $L_1$ and $L_2$ are assumed to have a constant Q of 20 in this example. The tunable impedance circuit 92 is adjustable and/or switchable so that a first effective capacitance $C_{1A}$ is provided when operating at 1 GHz, a second effective capacitance $C_{1B}$ is provided when operating at 0.9 GHz, and a third effective capacitance $C_{1C}$ is provided when operating at 0.8 GHz. For achieving these performance specifications, the tunable filter 90 can include components with the values shown in Table 2 below.

TABLE 2

| | L1 | C1A | C1B | C1C | L2 | C2 | C3 | K |
|---|---|---|---|---|---|---|---|---|
| Value | 4 nH | 0.90 pF | 1.27 pF | 2.10 pF | 4 nH | 1.26 pF | 2.24 pF | −0.084 |

Figure 12:
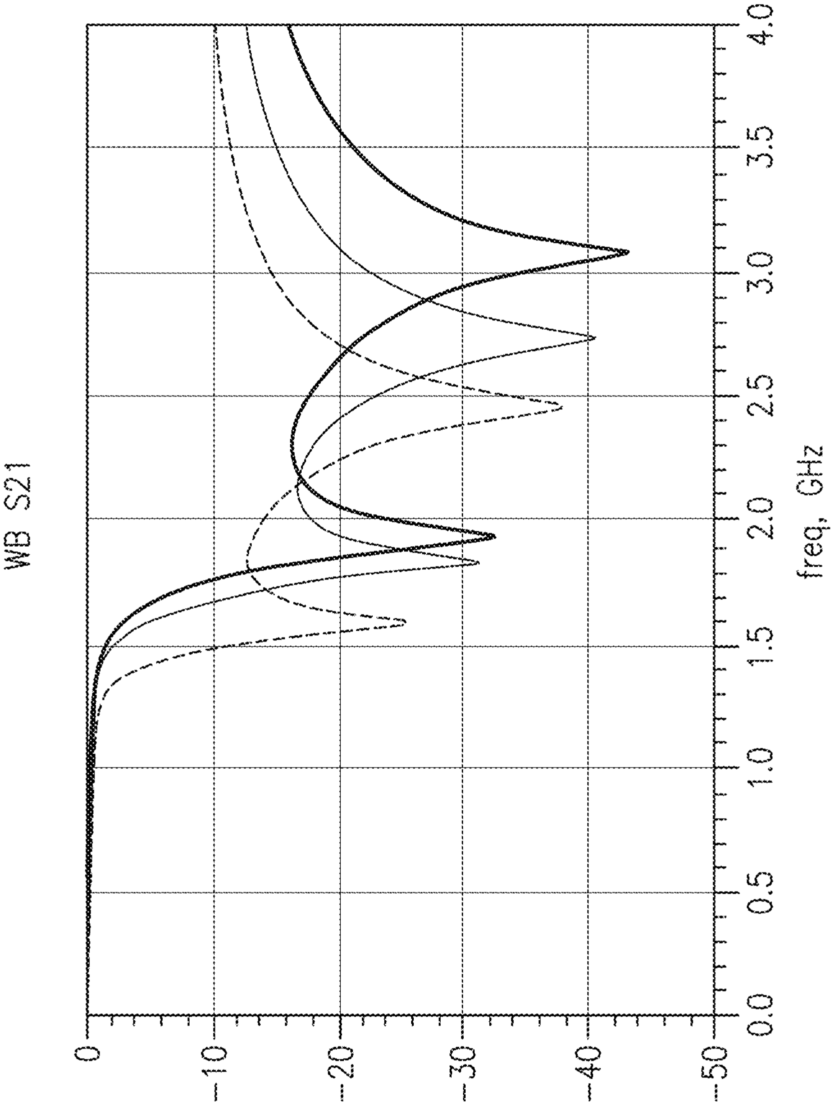
FIG. 12 is a graph of a simulation showing the locations of harmonic notches of the tunable filter of FIG. 9 according to a second design example.

FIG. 12 is a graph of a simulation showing the locations of the harmonic notches of the tunable filter 90 of FIG. 9 designed according to the second design example. A first curve in FIG. 12 shows locations of notches for second and third harmonics for operating at 1 GHz. A second curve in FIG. 12 shows locations of notches for second and third harmonics for operating at 0.9 GHz. A third curve in FIG. 12 shows locations of notches for second and third harmonics for operating at 0.8 GHz. These curves show locations of two notches in a frequency response of the tunable filter 90 changing by changing the effective capacitance of the tunable impedance circuit 92 for three different working frequencies. Accordingly, when the tunable impedance circuit 92 includes a switch arranged to selectively electrically couple an end of a capacitor to the first inductor $L_1$ to change state of the tunable impedance circuit 92, changing the state of the switch can change the location of two notches in the frequency response of the tunable filter 90.

Figure 13:
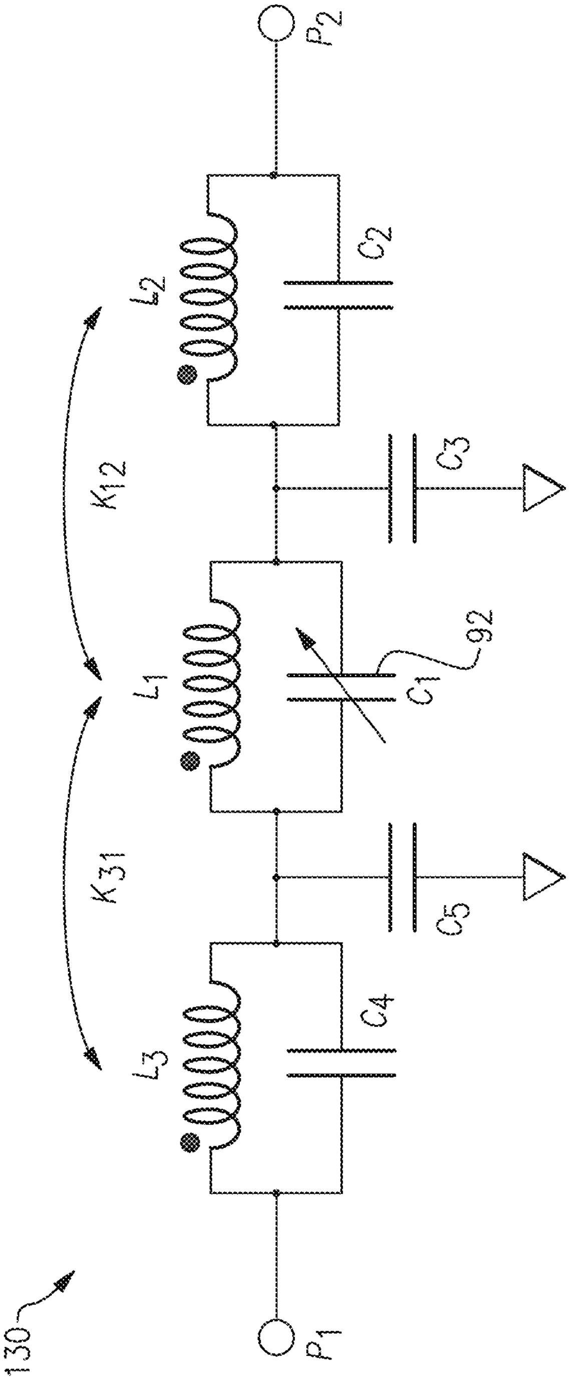
FIG. 13 is a schematic diagram of a tunable filter according to an embodiment.

FIG. 13 is a schematic diagram of a tunable filter 130 according to an embodiment. The tunable filter 130 is like the tunable filter 50 of FIG. 5 except that the tunable filter 130 has a tunable impedance circuit 92 instead of the tunable impedance circuit 42.

A third design example will now be discussed with reference to the tunable filter 130. In this example, the tunable filter 130 has two working frequencies (1 GHz and 0.9 GHz) by switching to two different effective capacitance values of the tunable impedance circuit 92. Each state has 2fo rejection>30 dB, 3fo rejection>50 dB, and 4fo rejection>60 dB, in which 2fo rejection is second harmonic rejection, 3fo is third harmonic rejection, and 4fo is fourth harmonic rejection. The inductors $L_1$ and $L_2$ are assumed to have a constant Q of 20 in this example. The tunable impedance circuit 92 is adjustable and/or switchable so that a first effective capacitance $C_{1A}$ is provided when operating at 1 GHz, and a second effective capacitance $C_{1B}$ is provided when operating at 0.9 GHz. For achieving these performance specifications, the tunable filter 130 can include components with the values shown in Tables 3A and 3B below.

TABLE 3A

| | L1 | C1A | C1B | L2 | C2 | C3 |
|---|---|---|---|---|---|---|
| Value | 7 nH | 0.38 pF | 0.71 pF | 2.5 nH | 0.84 pF | 2.5 pF |

TABLE 3B

| | C4 | C5 | L3 | K12 | K31 |
|---|---|---|---|---|---|
| Value | 1.81 pF | 2.5 pF | 2.5 nH | −0.017 | −0.086 |

Figure 14:
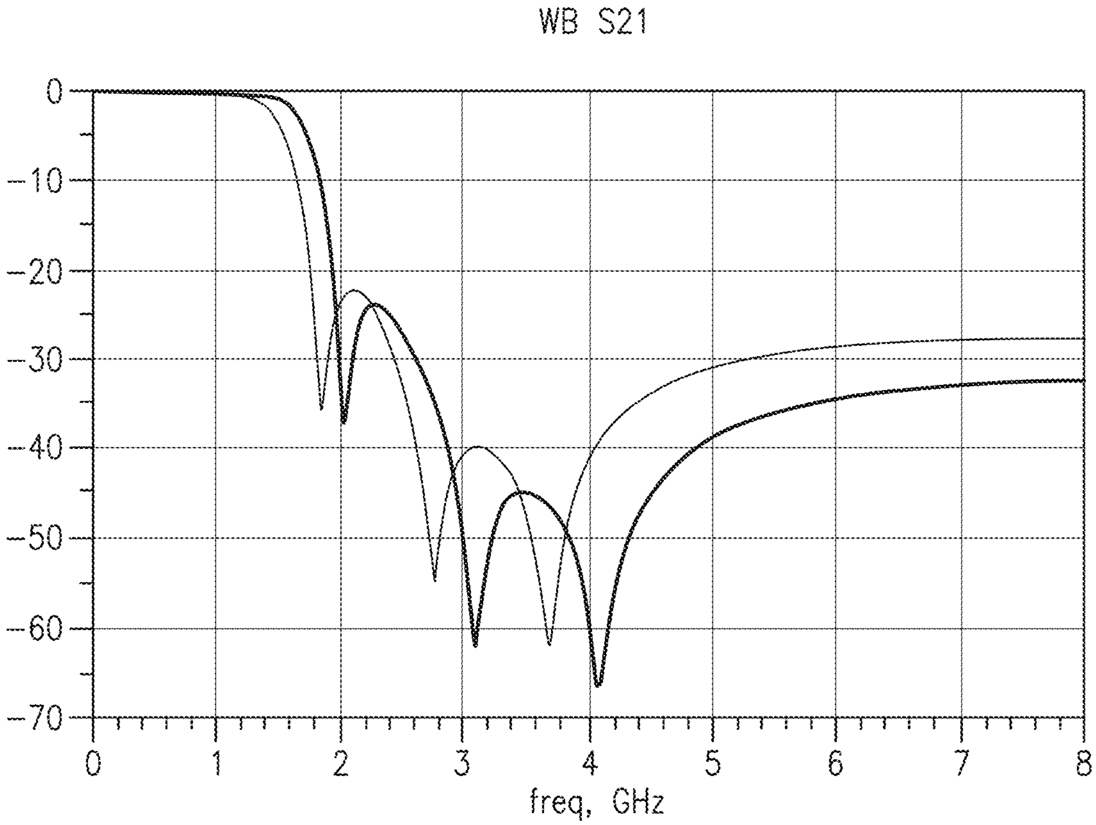
FIG. 14 is a graph of a simulation showing the locations of harmonic notches of the tunable filter of FIG. 13 according to a third design example.

FIG. 14 is a graph of a simulation showing the locations of the harmonic notches of the tunable filter 130 of FIG. 13 designed according to the third design example. A first curve in FIG. 14 shows locations of notches for second, third, and fourth harmonics for operating at 1 GHz. A second curve in FIG. 14 shows locations of notches for second, third, and fourth harmonics for operating at 0.9 GHz. These curves show locations of three notches in a frequency response of the tunable filter 130 changing by changing the effective capacitance of the tunable impedance circuit 92 for two different working frequencies.

Filter designs that can realize $M\times2^N$ harmonic states with N switch(es) are disclosed were M is an integer two or greater. The filter designs disclosed herein use inductive mutual coupling to increase harmonic tunable states. Example designs with M=2 (design examples 1 and 2) and M=3 (design example 3) have been described. Although embodiments disclosed herein may be related to low pass filters, any suitable principles and advantages disclosed herein can be implemented for other types of filters, such as high pass filters and/or band pass filters and/or band reject filters.

The principles and advantages disclosed herein can be implemented in a variety of filters. For example, filters disclosed herein can be or can be included in non-acoustic filters that include passive impedance elements. As another example, filters disclosed herein can be included in a hybrid filter that includes inductive and capacitive components together with one or more acoustic wave resonators in certain applications. For instance, the inductive and capacitive components can set a passband or stop band of such a hybrid filter and the one or more acoustic wave resonators can achieve one or more relatively sharp band edges for the hybrid filter.

Radio Frequency Systems with Tunable Filters

The tunable filters disclosed herein can be included in radio frequency systems, such as in a radio frequency front end. A tunable filter in accordance with any suitable principles and advantages disclosed herein be implemented at any suitable location in a system that could benefit from the harmonic rejection provided by filters disclosed herein.

Figure 15A:
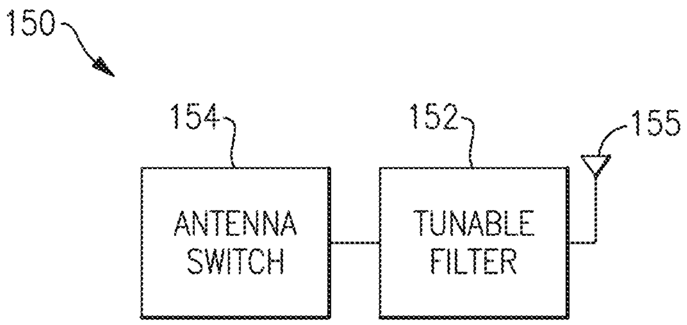
FIG. 15A is a schematic block diagram of a radio frequency system with a tunable filter according to an embodiment.

FIG. 15A is a schematic block diagram of a radio frequency system 150 with a tunable filter 152. As shown in FIG. 15A, the tunable filter 152 is coupled between an antenna switch 154 and an antenna 155. The tunable filter 152 can be implemented in accordance with any suitable principles and advantages disclosed herein to provide harmonic rejection for radio frequency signal propagating between the antenna switch 154 and the antenna 155.

Figure 15B:
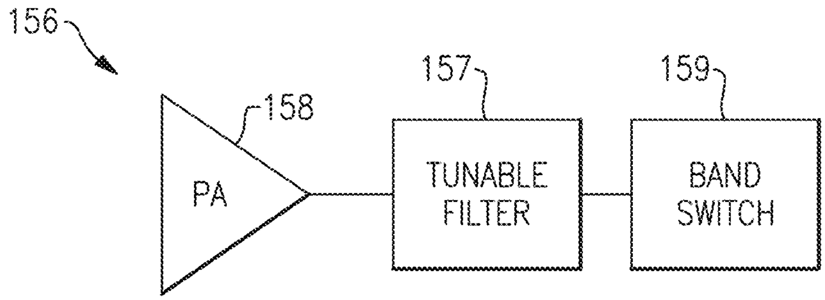
FIG. 15B is a schematic block diagram of a radio frequency system with a tunable filter according to another embodiment.

FIG. 15B is a schematic block diagram of a radio frequency system 156 with a tunable filter 157. As shown in FIG. 15B, the tunable filter 157 is coupled between a power amplifier 158 and a band select switch 159. The band select switch 159 can electrically connect an output of the power amplifier 158 to a radio frequency signal path for a particular operating band. Such a radio frequency signal path can include a band pass filter having a passband corresponding to the operating band. The band select switch 159 is an example of a multi-throw switch that can selective electrically connect the tunable filter 157 to a selected radio frequency signal path. The tunable filter 157 can be implemented in accordance with any suitable principles and advantages disclosed herein to provide harmonic rejection for radio frequency signal propagating between an output of the power amplifier 158 and the band select switch 159.

Wireless Communication Devices

The tunable filters disclosed herein can be included in wireless communication devices, such as mobile devices. One or more tunable filters in accordance with any suitable principles and advantages disclosed herein can be implemented in any suitable wireless communication device. An example of such a wireless communication device will be discussed with reference to FIG. 16.

Figure 16:
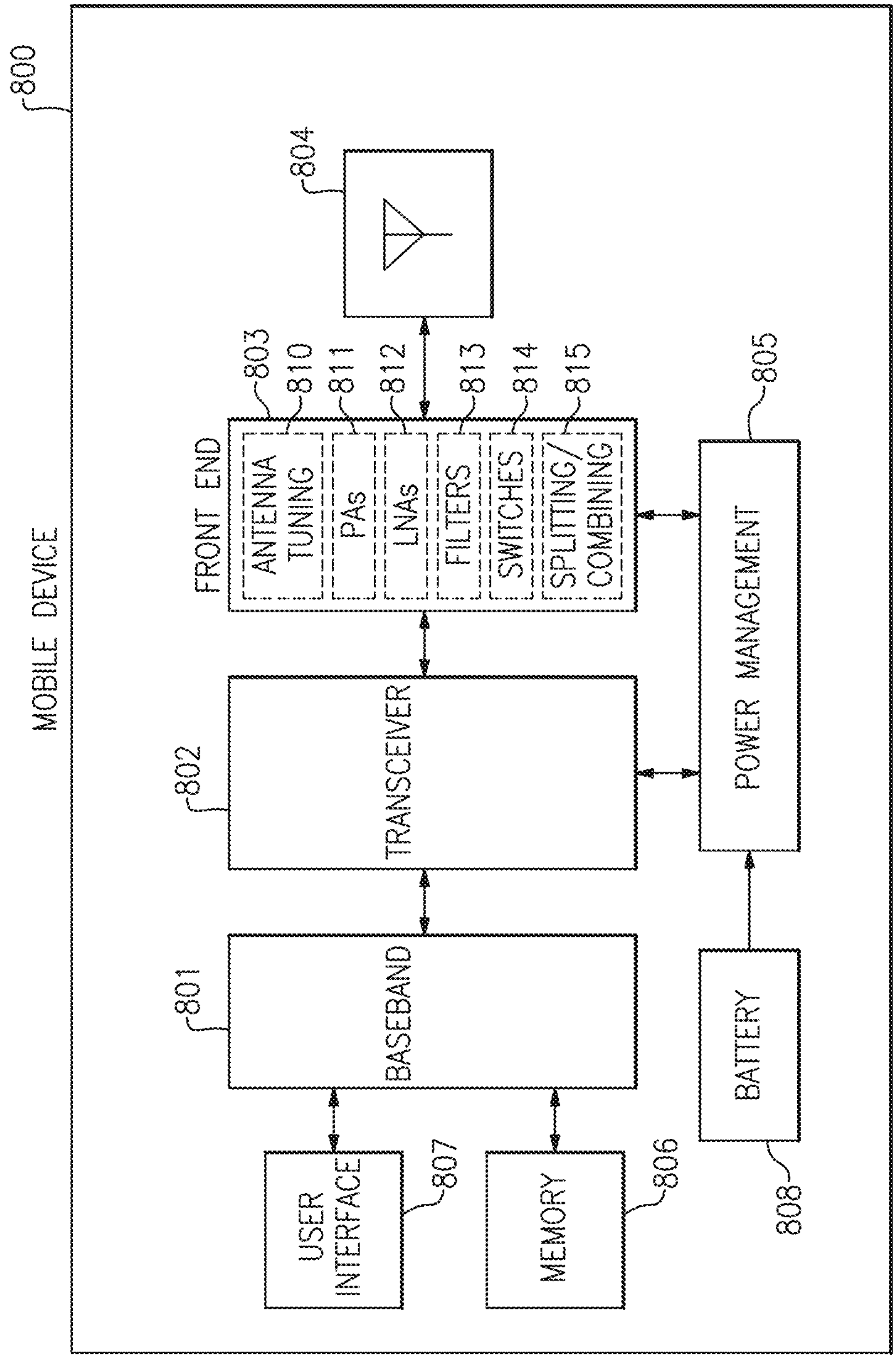
FIG. 16 is a schematic diagram of one embodiment of a mobile device.

FIG. 16 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 16 as the transceiver 802. In one example, separate components (for instance, separate circuits or dies) can be provided for handling certain types of RF signals.

The front end system 803 aids in conditioning signals transmitted to and/or received from the antennas 804. In the illustrated embodiment, the front end system 803 includes antenna tuning circuitry 810, power amplifiers (PAS) 811, low noise amplifiers (LNAs) 812, filters 813, switches 814, and signal splitting/combining circuitry 815. However, other implementations are possible. The filters 813 can include one or more tunable filters with harmonic rejection with that include one or more features of the embodiments disclosed herein.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 16, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 16, the power management system 805 receives a battery voltage from the battery 808. The battery 808 can be any suitable battery for use in the mobile device 800, including, for example, a lithium-ion battery.

Applications, Terminology, and Conclusion

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 450 MHz to 8.5 GHz. Tunable filters disclosed herein can filter RF signals at frequencies up to and including millimeter wave frequencies, for example, frequencies within FR2 of a 5G NR specification.

Aspects of this disclosure can be implemented in various electronic devices. Examples of the electronic devices can include, but are not limited to, consumer electronic products, parts of the consumer electronic products such as packaged radio frequency modules, radio frequency filter die, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words “comprise,” “comprising,” “include,” “including” and the like are to generally be construed in an inclusive sense, as opposed to an exclusive or exhaustive sense; that is to say, in the sense of “including, but not limited to.” Conditional language used herein, such as, among others, “can,” “could,” “might,” “may,” “e.g.,” “for example,” “such as” and the like, unless specifically stated otherwise, or otherwise understood within the context as used, is generally intended to convey that certain embodiments include, while other embodiments do not include, certain features, elements and/or states. The word “coupled”, as generally used herein, refers to two or more elements that may be either directly connected, or connected by way of one or more intermediate elements. Likewise, the word “connected”, as generally used herein, refers to two or more elements that may be either directly connected, or connected by way of one or more intermediate elements. Additionally, the words “herein,” “above,”

"below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel filters, wireless communication devices, apparatus, methods, and systems described herein may be embodied in a variety of other forms. Furthermore, various omissions, substitutions and changes in the form of the filters, wireless communication devices, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A tunable filter with tunable rejection, the tunable filter comprising:
- a first inductor;
- a second inductor mutually coupled with the first inductor; and
- a tunable capacitance circuit electrically connected to the first inductor, the tunable capacitance circuit including switches, each of the switches configured to adjust effective capacitance of the tunable capacitance circuit to tune rejection of the tunable filter for at least two harmonics of interest, the at least two harmonics of interest including at least one second harmonic and at least one third harmonic.

2. The tunable filter of claim 1 wherein each of the switches is configured to tune harmonic rejection for at least three harmonics of interest.

3. The tunable filter of claim 1 wherein the at least two harmonics of interest include at least one harmonic associated with a fifth generation New Radio operating band and at least one harmonic associated with a fourth generation Long Term Evolution operating band.

4. The tunable filter of claim 1 wherein the tunable capacitance circuit includes capacitors, each capacitor of the capacitors being in series with a respective switch of the switches.

5. The tunable filter of claim 1 wherein the tunable capacitance circuit includes a first capacitor and a second capacitor, the switches include a first switch and a second switch, the first switch is configured to selectively electrically couple an end of the first capacitor to the first inductor, and the second switch is configured to selectively electrically couple an end of the second capacitor to the first inductor.

6. The tunable filter of claim 1 wherein the tunable capacitance circuit is in parallel with the first inductor.

7. The tunable filter of claim 1 wherein the first inductor is a series inductor, and the second inductor is a shunt inductor.

8. The tunable filter of claim 1 wherein the first inductor is a series inductor, and the second inductor is a shunt inductor.

9. A wireless communication system comprising:
- a power amplifier;
- the tunable filter of claim 1; and
- an antenna configured to transmit a radio frequency signal filtered by the tunable filter.

10. A tunable filter with tunable rejection, the tunable filter comprising:
- a first inductor;
- a second inductor mutually coupled with the first inductor, the first inductor being in series with the second inductor; and
- a tunable capacitance circuit in parallel with the first inductor, the tunable capacitance circuit including switches, each of the switches configured to adjust effective capacitance of the tunable capacitance circuit to tune rejection of the tunable filter for at least two harmonics of interest.

11. The tunable filter of claim 8 wherein the at least two harmonics of interest include at least one second harmonic and at least one third harmonic.

12. The tunable filter of claim 10 further comprising a second tunable capacitance circuit in parallel with the second inductor.

13. The tunable filter of claim 10 further comprising a fixed capacitor in parallel with the second inductor.

14. The tunable filter of claim 10 further comprising a shunt tunable capacitance circuit connected to a node between the first inductor and the second inductor.

15. A tunable filter with tunable rejection, the tunable filter comprising:
- a first inductor;
- a second inductor mutually coupled with the first inductor;
- a third inductor mutually coupled with the first inductor; and
- a tunable capacitance circuit electrically connected to the first inductor, the tunable capacitance circuit including switches, each of the switches configured to adjust effective capacitance of the tunable capacitance circuit to tune rejection of the tunable filter for at least two harmonics of interest.

16. The tunable filter of claim 15 wherein the first inductor, the second inductor, and the third inductor are in series with each other.

17. The tunable filter of claim 15 wherein the first inductor and the second inductor are series inductors, and the third inductor is a shunt inductor.

18. A tunable filter with tunable rejection, the tunable filter comprising:
- a first inductor;
- a second inductor mutually coupled with the first inductor; and
- a tunable capacitance circuit in parallel with the first inductor, the tunable capacitance circuit configured to adjust an effective capacitance in parallel with the first inductor to tune rejection of the tunable filter for at least three harmonics of interest.

19. The tunable filter of claim 18 wherein the tunable capacitance circuit includes a switch in series with a capacitor, the switch configured to selectively electrically connect the capacitor to an end of the first inductor to adjust the effective capacitance.

20. The tunable filter of claim 18 wherein the tunable capacitance circuit includes a varactor.

* * * * *